United States Patent
Kim et al.

(10) Patent No.: US 12,550,322 B2
(45) Date of Patent: Feb. 10, 2026

(54) VERTICAL MEMORY DEVICES

(71) Applicant: SAMSUNG ELECTRONICS CO., LTD., Suwon-si (KR)

(72) Inventors: Donghwan Kim, Seongnam-si (KR); Younghwan Son, Hwaseong-si (KR); Shinhwan Kwan, Suwon-si (KR); Jeehoon Han, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/220,073

(22) Filed: Jul. 10, 2023

(65) Prior Publication Data

US 2023/0354594 A1 Nov. 2, 2023

Related U.S. Application Data

(63) Continuation of application No. 17/019,693, filed on Sep. 14, 2020, now abandoned.

(30) Foreign Application Priority Data

Dec. 19, 2019 (KR) .......................... 10-2019-0171208

(51) Int. Cl.
*H10B 43/27* (2023.01)
*G11C 5/02* (2006.01)
(Continued)

(52) U.S. Cl.
CPC ............. *H10B 41/27* (2023.02); *G11C 5/025* (2013.01); *H01L 23/5384* (2013.01); *H10B 43/27* (2023.02)

(58) Field of Classification Search
None
See application file for complete search history.

(56) References Cited

U.S. PATENT DOCUMENTS

| | | |
|---|---|---|
| 8,765,598 B2 | 7/2014 | Smith et al. |
| 9,029,938 B2 | 5/2015 | Nakaki |
| (Continued) | | |

FOREIGN PATENT DOCUMENTS

| | | |
|---|---|---|
| JP | 20150056452 A | 3/2015 |
| KR | 20170139390 A | 12/2017 |
| (Continued) | | |

OTHER PUBLICATIONS

Office Action in Korean Appln. No. 10-2019-0171208, mailed on Feb. 6, 2024, 23 pages (with English translation).

*Primary Examiner* — Sarah K Salerno
(74) *Attorney, Agent, or Firm* — Wolf, Greenfield & Sacks, P.C.

(57) ABSTRACT

A vertical memory device includes gate electrodes, a channel, a first conductive through via, and insulation structures. The gate electrodes are spaced apart from each other on a substrate in a first direction substantially perpendicular to an upper surface of the substrate, and may be stacked in a staircase shape. The channel extends through the gate electrodes in the first direction. The first conductive through via extends through a conductive pad of a first gate electrode among the gate electrodes and is electrically connected thereto. The first conductive through via extends through second gate electrodes from among the gate electrodes that are under the first gate electrode. The insulation structures are formed between the first conductive through via and sidewalls of each of the second gate electrodes, and electrically insulates the first conductive through via from each of the second gate electrodes.

20 Claims, 40 Drawing Sheets

(51) Int. Cl.
    *H01L 23/538*      (2006.01)
    *H10B 41/27*      (2023.01)

(56) References Cited

U.S. PATENT DOCUMENTS

| | | |
|---|---|---|
| 9,524,903 B2 | 12/2016 | Lee |
| 9,679,946 B2 | 6/2017 | Shepard |
| 9,991,271 B2 | 6/2018 | Kang et al. |
| 10,141,326 B1 | 11/2018 | Oh et al. |
| 10,192,928 B2 | 1/2019 | Fukuda et al. |
| 10,192,929 B2 | 1/2019 | Mori |
| 10,396,035 B2 | 8/2019 | Park |
| 2012/0306090 A1 | 12/2012 | Smith et al. |
| 2017/0148811 A1 | 5/2017 | Zhang et al. |
| 2018/0226423 A1 | 8/2018 | Kang et al. |
| 2019/0164983 A1* | 5/2019 | Hu ................... H10B 41/35 |
| 2019/0164986 A1* | 5/2019 | Tsuda ............... H10D 30/0413 |
| 2019/0378857 A1 | 12/2019 | Lee |
| 2020/0043943 A1* | 2/2020 | Kang ................. H01L 29/456 |
| 2020/0194453 A1 | 6/2020 | Lim |
| 2020/0312868 A1* | 10/2020 | Xiao ................. G11C 16/0466 |
| 2020/0350249 A1 | 11/2020 | Kim et al. |
| 2021/0118902 A1 | 4/2021 | Kanamori et al. |
| 2023/0292515 A1 | 9/2023 | Son et al. |

FOREIGN PATENT DOCUMENTS

| | | |
|---|---|---|
| KR | 10-2018-0042358 | 4/2018 |
| KR | 10-2019-0026418 | 3/2019 |
| KR | 10-2019-0122372 | 10/2019 |

\* cited by examiner

VERTICAL MEMORY DEVICES

CROSS-REFERENCE TO RELATED APPLICATION

This is a Continuation of U.S. application Ser. No. 17/019,693, filed Sep. 14, 2020, and a claim of priority is made to Korean Patent Application No. 10-2019-0171208, filed on Dec. 19, 2019 in the Korean Intellectual Property Office (KIPO), the entirety of which is hereby incorporated by reference.

BACKGROUND

The present disclosure relates to vertical memory devices.

In VNAND flash memory devices, contact plugs contacting corresponding gate electrodes a pad region of a substrate may sometimes also contact underlying gate electrodes by punch-through. This may cause an electrical short between the gate electrode and a corresponding underlying gate electrode(s). Thus, a method of preventing such electrical shorts is needed.

SUMMARY

Embodiments of the inventive concepts provide a vertical memory device having improved electrical characteristics.

Embodiments of the inventive concepts provide a vertical memory device. The vertical memory device may include gate electrodes, a channel, a first conductive through via, and an insulation structure. The gate electrodes may be spaced apart from each other on a substrate in a first direction substantially perpendicular to an upper surface of the substrate, and may be stacked in a staircase shape. The channel may extend through the gate electrodes in the first direction. The first conductive through via may extend through a conductive pad of a first gate electrode from among the gate electrodes and be electrically connected to the conductive pad. The first conductive through via may extend through second gate electrodes from among the gate electrodes that are disposed under the first gate electrode. The insulation structures may be formed between the first conductive through via and sidewalls of each of the second gate electrodes facing the first conductive through via, and electrically insulate the first conductive through via from each of the second gate electrodes.

Embodiments of the inventive concepts further provide a vertical memory device. The vertical memory device may include gate electrodes, a channel, and first to third conductive through vias. The gate electrodes may be spaced apart from each other on first and second regions of the substrate in a first direction substantially perpendicular to an upper surface of the substrate. The substrate includes the first and second regions and a third region, and may have a staircase shape on the second region of the substrate. The channel may extend through the gate electrodes in the first direction on the first region of the substrate. The first conductive through via may extend through some of the gate electrodes on the second region of the substrate, the first conductive through via being electrically connected to a first gate electrode at an uppermost level of the some of the gate electrodes, and may be electrically insulated from second gate electrodes from among the some of the gate electrodes that are under the first gate electrode. The second conductive through via may be formed at a same level as the first conductive through via on the third region of the substrate. The third conductive through via may be formed at the same level as the first conductive through via on the first region of the substrate, and may extend through the gate electrodes and be electrically insulated therefrom. The first to third conductive through vias may have a same width. Each of the first to third conductive through vias may include a vertical portion extending in the first direction, and a slope portion having a width that gradually increases from a bottom of the slope portion toward a top of the slope portion.

Embodiments of the inventive concepts still further provide a vertical memory device. The vertical memory device may include gate electrodes, a channel, and a first conductive through via. The gate electrodes may be spaced apart from each other on a substrate in a first direction substantially perpendicular to an upper surface of the substrate, and may be stacked in a staircase shape. The channel may extend through the gate electrodes in the first direction. The first conductive through via may extend through some of the gate electrodes on the substrate, and may extend through a conductive pad of a first gate electrode at an uppermost level of the some of the gate electrodes and be electrically connected to the conductive pad. The first conductive through via may be electrically insulated from second gate electrodes from among the some of the gate electrodes that are under the first gate electrode. The first conductive through via may include a vertical portion extending in the first direction, a protrusion portion protruding from the vertical portion in a horizontal direction substantially parallel to the upper surface of the substrate, and a slope portion on the vertical portion having a width that gradually increases from a bottom of the slope portion toward a top of the slope portion.

Embodiments of the inventive concepts also provide a vertical memory device. The vertical memory device may include transistors on a substrate; lower wirings electrically connected to the transistors on the substrate; a common source plate (CSP) on the lower wirings; a channel connection pattern and a support layer sequentially stacked on the CSP; gate electrodes spaced apart from each other on the substrate in a first direction substantially perpendicular to an upper surface of the substrate and stacked in a staircase shape on the substrate; channels electrically connected with each other by the channel connection pattern, each of which may extend through the gate electrodes, the support layer and the channel connection pattern in the first direction on the CSP; first to third conductive through vias; and insulation structures. The first conductive through via may extend through some of the gate electrodes on the substrate, the first conductive through via being electrically connected to a first gate electrode at an uppermost level of the some of the gate electrodes, and may be electrically insulated from second gate electrodes from among the some of the gate electrodes under the first gate electrode. The second conductive through via may be formed at a same level as the first conductive through via, may not extend through the gate electrodes, and may be electrically connected to one of the lower wirings. The third conductive through via may be formed at the same level as the first conductive through via, and may extend through the gate electrodes, the channel connection pattern, the support layer and the CSP to be electrically connected to another one of the lower wirings. The insulation structures may be formed between the first conductive through via and sidewalls of each of the second gate electrodes and may electrically insulate the first conductive through via from each of the second gate electrodes, and may be formed between the third conductive through via and sidewalls of each of the gate electrodes and may electrically insulate the third conductive through via from each of the gate electrodes.

In the vertical memory device in accordance with example embodiments, the first conductive through via electrically connected to the conductive pad of the corresponding one of the gate electrodes on the pad region of the substrate may extend through other ones of the gate electrodes under the corresponding one of the gate electrodes, and however may be electrically insulated from the other ones of the gate electrodes by an insulation pattern and a spacer. Thus, the first conductive through via may be formed by the same processes for forming the second and third conductive through vias on the cell region and the peripheral circuit region, respectively, of the substrate so as to simplify the total process. Additionally, the first conductive through via may receive electrical signals from the lower wiring, so that there is no need to form an upper wiring to apply electrical signals to the first conductive through via, and thus freedom of layout of the upper wiring may be increased.

Furthermore, the first conductive through via may support the mold during forming of the gate electrodes, and thus additional dummy channels need not be formed in order to support the mold in the case where only the first conductive through via is formed in each of the conductive pads. Accordingly, the first conductive through via may have a relatively large size because there is no need to keep a distance between the first conductive through via and dummy channels, so that the freedom of layout of the first conductive through via may be increased.

DESCRIPTION OF EMBODIMENTS

Vertical memory devices and methods of manufacturing the same in accordance with example embodiments of the inventive concepts will be described hereinafter with reference to the accompanying drawings. It should be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section.

Hereinafter in the specification (and not necessarily in the claims), a direction substantially perpendicular to an upper surface of a substrate may be defined as a first direction, and two directions substantially parallel to the upper surface of the substrate and crossing each other may be defined as second and third directions, respectively. In example embodiments, the second and third directions may be substantially perpendicular to each other.

FIGS. 1 to 33 are plan views and cross-sectional views illustrating a method of manufacturing a vertical memory device in accordance with example embodiments. Specifically, FIGS. 1, 6, 8, 15, 22 and 29 are the plan views, and FIGS. 2-5, 7, 9-14, 16-21, 23-28 and 30-33 are the cross-sectional views.

FIGS. 2-5, 7, 9, 23, 25, 30 and 33 are cross-sectional views taken along lines A-A' of corresponding plan views, respectively, FIGS. 11-14, 20, 27-28 and 32 are cross-sectional views taken along lines B-B' of corresponding plan views, respectively, and FIGS. 16-19 and 21 are cross-sectional views taken along lines C-C' of corresponding plan views, respectively. FIGS. 10, 24, 26 and 31 are enlarged cross-sectional views of regions X of FIGS. 9, 23, 25 and 30, respectively.

Figure 1:
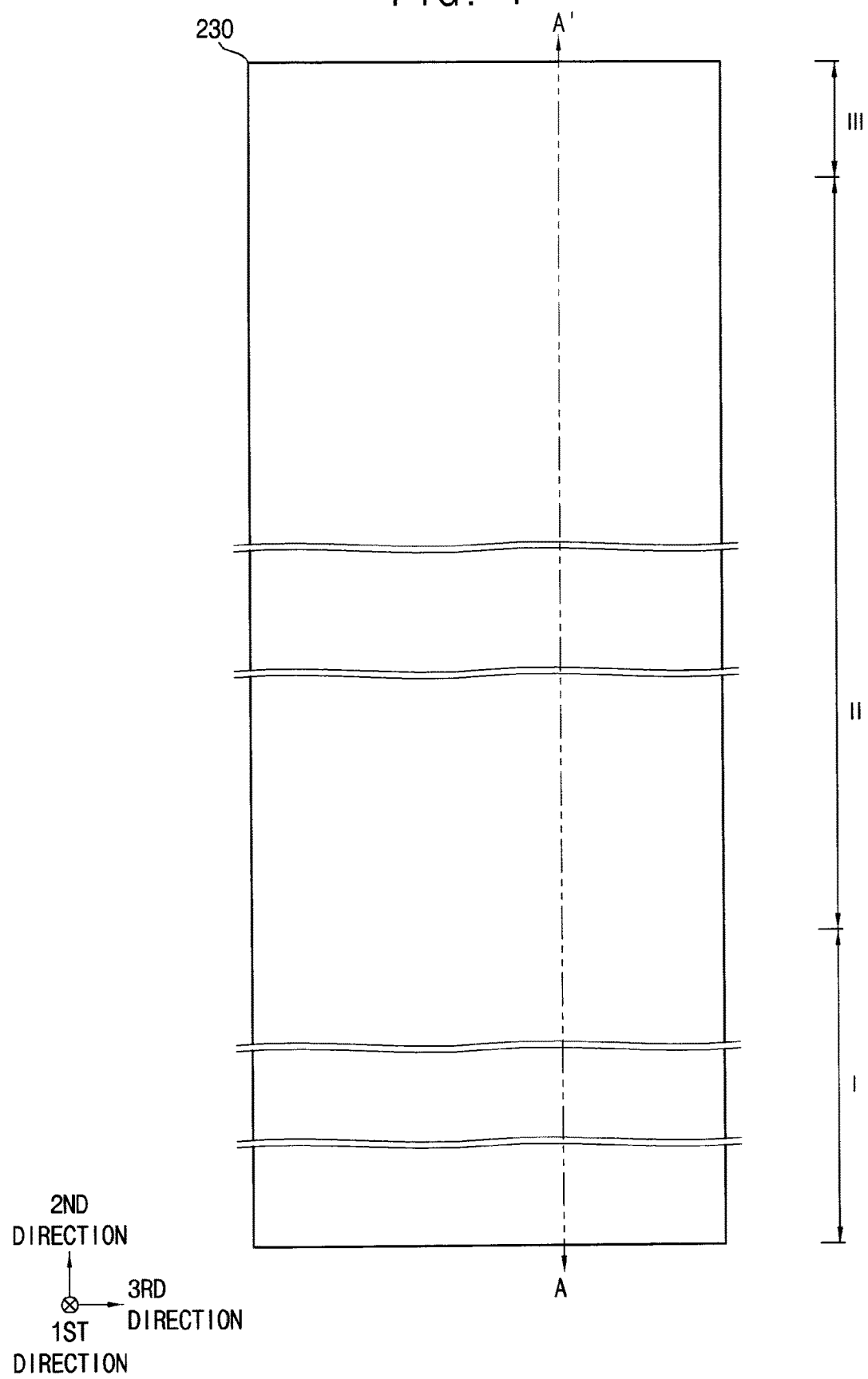
FIG. 1 illustrates a plan view descriptive of a method of manufacturing a vertical memory device in accordance with example embodiments of the inventive concepts.
Figure 2:
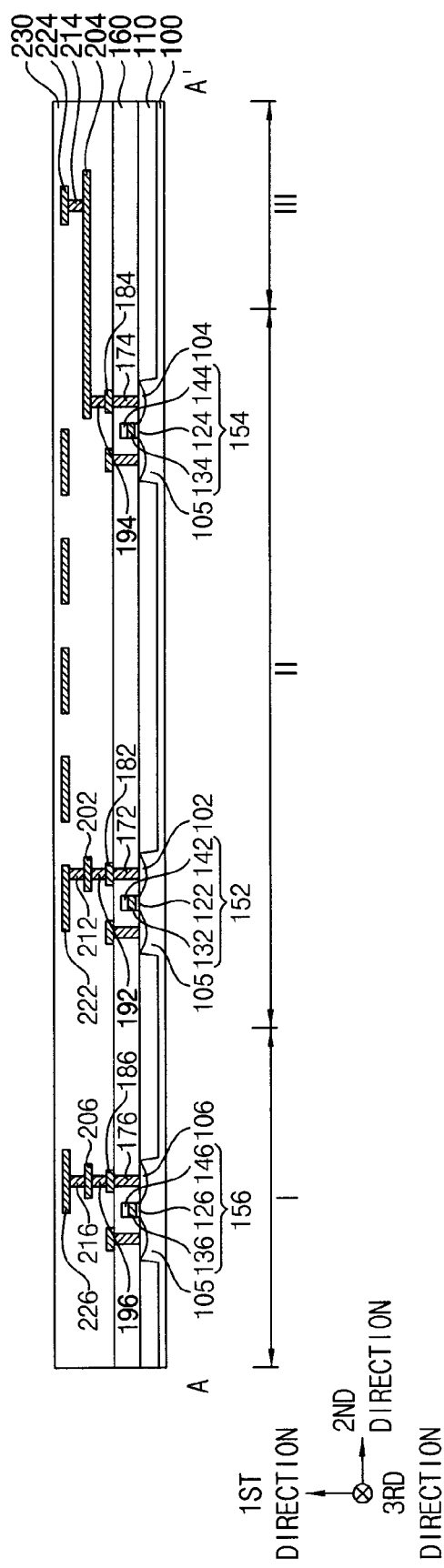
FIG. 2 illustrates a cross-sectional view taken along line A-A' in FIG. 1 descriptive of the method of manufacturing the vertical memory device.

Referring to FIGS. 1 and 2, a lower circuit pattern may be formed on a substrate 100, and first and second insulating interlayers 160 and 230 may be sequentially formed on the substrate 100 to cover the lower circuit pattern.

The substrate 100 may include semiconductor materials such as for example silicon, germanium, silicon-germanium, or the like, or III-V compounds such as for example GaP, GaAs, GaSb, or the like. In example embodiments, the substrate 100 may be for example a silicon-on-insulator (SOI) substrate or a germanium-on-insulator (GOI) substrate.

The substrate 100 may include a field region on which an isolation pattern 110 is formed, and an active region 105 on which no isolation pattern is formed. The isolation pattern 110 may be formed by for example a shallow trench isolation (STI) process, and may include an oxide such as for example silicon oxide.

In example embodiments, the substrate 100 may include first to third regions I, II and III. The first region I may be a cell array region in which memory cells are formed, the second region II may be an extension region or pad region at least partially surrounding the first region I in which upper contact plugs transferring electrical signals to the memory cells are formed, and the third region III may be a peripheral circuit region at least partially surrounding second region II in which some of conductive through vias transferring electrical signals to the lower circuit pattern are formed. The first and second regions I and II may form a cell region, and thus the peripheral circuit region may at least partially surround the cell region. FIGS. 1 and 2 show a portion of each of the first to third regions I, II and III of the substrate.

In example embodiments, the vertical memory device may have a cell-over-periphery (COP) structure. That is, the lower circuit pattern may be formed on the substrate 100, and the memory cells, the upper contact plugs and the conductive through vias may be formed over the lower circuit pattern.

The lower circuit pattern may include transistors, lower contact plugs, lower wirings, lower vias, or the like. In an example embodiment, a first transistor including a first lower gate structure 152 on the substrate 100 and a first impurity region 102 at an upper portion of the active region 105 adjacent the first lower gate structure 152, a second transistor including a second lower gate structure 154 on the substrate 100 and a second impurity region 104 at an upper portion of the active region 105 adjacent the second lower gate structure 154, and a third transistor including a third lower gate structure 156 on the substrate 100 and a third impurity region 106 at an upper portion of the active region 105 adjacent the third lower gate structure 156 may be formed.

In FIG. 2, the first to third transistors are formed on the first and second regions I and II of the substrate 100, however, the inventive concepts are not be limited thereto, and additional transistors may be further formed on the third region III of the substrate 100.

The first lower gate structure 152 may include a first lower gate insulation pattern 122, a first lower gate electrode 132 and a first lower gate mask 142 sequentially stacked on the substrate 100, the second lower gate structure 154 may include a second lower gate insulation pattern 124, a second lower gate electrode 134 and a second lower gate mask 144 sequentially stacked on the substrate 100, and the third lower gate structure 156 may include a third lower gate insulation pattern 126, a third lower gate electrode 136 and a third lower gate mask 146 sequentially stacked on the substrate 100.

The first insulating interlayer 160 may be formed on the substrate 100 to cover the first, second and third transistors, and first to third lower contact plugs 172, 174 and 176 may be formed through the first insulating interlayer 160 to contact the first to third impurity regions 102, 104 and 106, respectively.

First to third lower wirings 182, 184 and 186 may be formed on the first insulating interlayer 160 to contact the first to third lower contact plugs 172, 174 and 176, respectively. A first lower via 192, a fourth lower wiring 202, a fourth lower via 212 and a seventh lower wiring 222 may be sequentially stacked on the first lower wiring 182, a second lower via 194, a fifth lower wiring 204, a fifth lower via 214 and an eighth lower wiring 224 may be sequentially stacked on the second lower wiring 184, and a third lower via 196, a sixth lower wiring 206, a sixth lower via 216 and a ninth lower wiring 226 may be sequentially stacked on the third lower wiring 186.

The first to third lower contact plugs 172, 174 and 176, the first to sixth lower vias 192, 194, 196, 212, 214 and 216, and the first to ninth lower wirings 182, 184, 186, 202, 204, 206, 222, 224 and 226 may include a conductive material such as for example a metal, a metal nitride, a metal silicide, doped polysilicon, or other conductive material.

The second insulating interlayer 230 may be formed on the first insulating interlayer 160 to cover the first to ninth lower wirings 182, 184, 186, 202, 204, 206, 222, 224 and 226 and the first to sixth lower vias 192, 194, 196, 212, 214 and 216. The second insulating interlayer 230 and the first insulating interlayer 160 may form a lower insulating interlayer structure, and in some cases, may include a single layer because the first and second insulating interlayers 160 and 230 may include the same material such as for example silicon oxide merged with each other.

The first to third lower gate structures 152, 154 and 156, the first to third lower contact plugs 172, 174 and 176, the first to sixth lower vias 192, 194, 196, 212, 214 and 216, and the first to ninth lower wirings 182, 184, 186, 202, 204, 206, 222, 224 and 226 may be formed by a patterning process or a damascene process.

Figure 3:
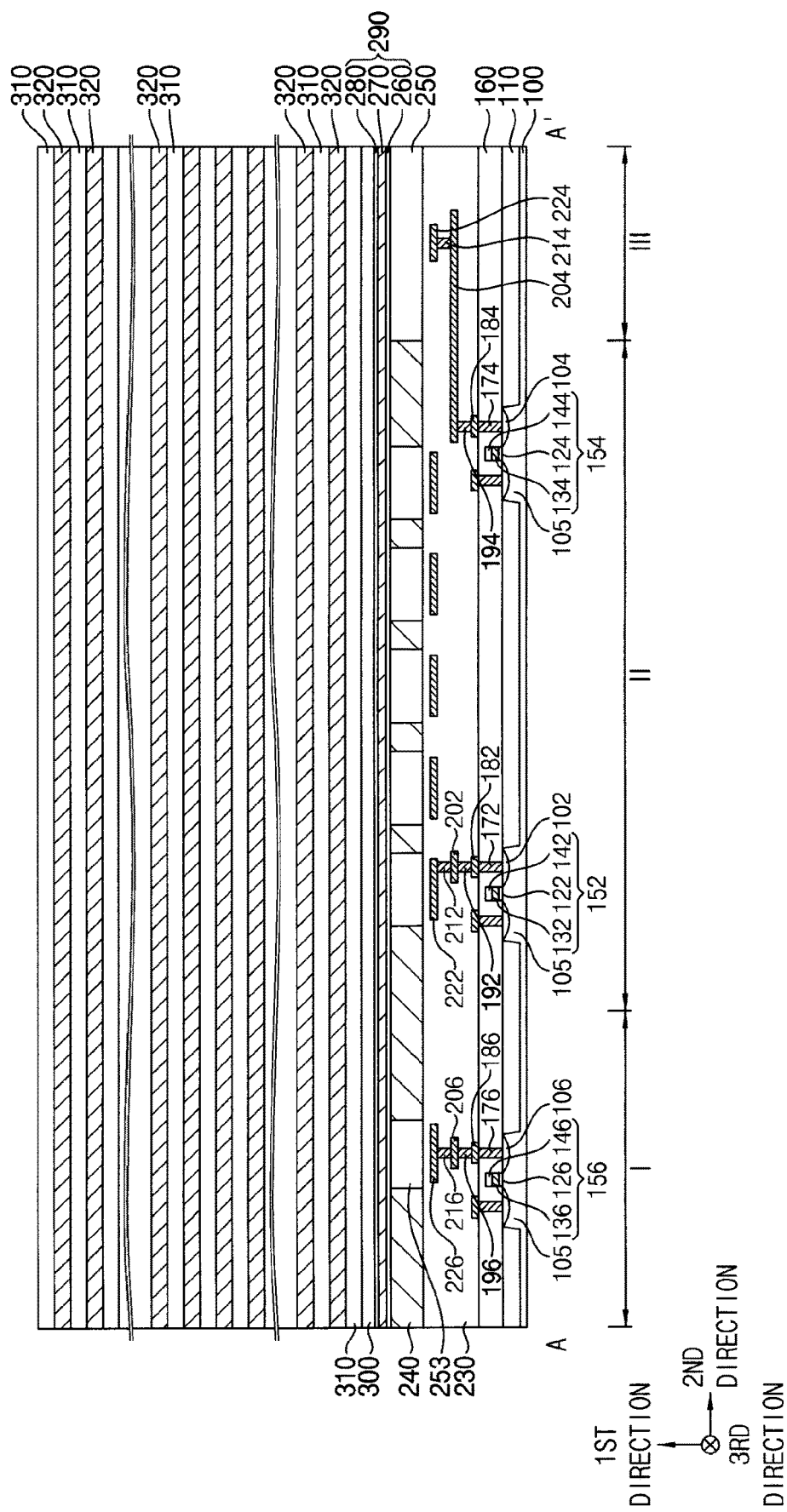
FIG. 3 illustrates a cross-sectional view taken along line A-A' in FIG. 1 further descriptive of the method of manufacturing the vertical memory device.

Referring to FIG. 3, a common source plate (CSP) 240, and third and fourth insulating interlayer patterns 250 and 253 may be formed on the second insulating interlayer 230.

The CSP 240 may be formed on the second insulating interlayer 230, and may be patterned to remain only on the first and second regions I and II of the substrate 100. Additionally, the CSP 240 may be patterned so as not to remain in areas in which first and third through holes 422 and 426 (refer to FIGS. 8 to 11) for forming first and third conductive through vias 622 and 626, respectively, (refer to FIGS. 29 to 32) may be formed. That is, CSP 240 may include opening over the first and second regions I and II.

The third and fourth insulating interlayer patterns 250 and 253 may be formed by forming a third insulating interlayer on the second insulating interlayer 230 (including in the openings in CSP 240) and planarizing the third insulating interlayer until an upper surface of the CSP 240 is exposed. Thus, the third insulating interlayer pattern 250 may be formed on the third region III of the substrate 100, and the fourth insulating interlayer pattern 253 may be formed in the openings of the CSP 240 on the first and second regions I and II of the substrate 100.

The CSP 240 may include polysilicon doped with n-type impurities, and the third and fourth insulating interlayer patterns 250 and 253 may include an oxide such as for example silicon oxide.

A sacrificial layer structure 290 and a support layer 300 may be sequentially formed on the CSP 240 and the third and fourth insulating interlayer patterns 250 and 253.

The sacrificial layer structure 290 may include first to third sacrificial layers 260, 270 and 280 sequentially stacked. The first and third sacrificial layers 260 and 280 may include an oxide such as for example silicon oxide, and the second sacrificial layer 270 may include a nitride such as for example silicon nitride.

The support layer 300 may include a material having an etching selectivity with respect to the first to third sacrificial layers 260, 270 and 280, such as for example undoped polysilicon or polysilicon doped with n-type impurities. A portion of the support layer 300 may extend through the sacrificial layer structure 290 to contact an upper surface of the CSP 240, which may form a support pattern (not shown).

A first insulation layer 310 and a fourth sacrificial layer 320 may be alternately and repeatedly stacked on the support layer 300. Accordingly, a mold layer including a plurality of insulation layers 310 and a plurality of fourth sacrificial layers 320 alternately and repeatedly stacked in the first direction may be formed. The first insulation layer 310 may include an oxide such as for example silicon oxide, and the fourth sacrificial layer 320 may include a material having an etching selectivity with respect to the first insulation layer 310, such as for example a nitride such as silicon nitride.

Figure 4:
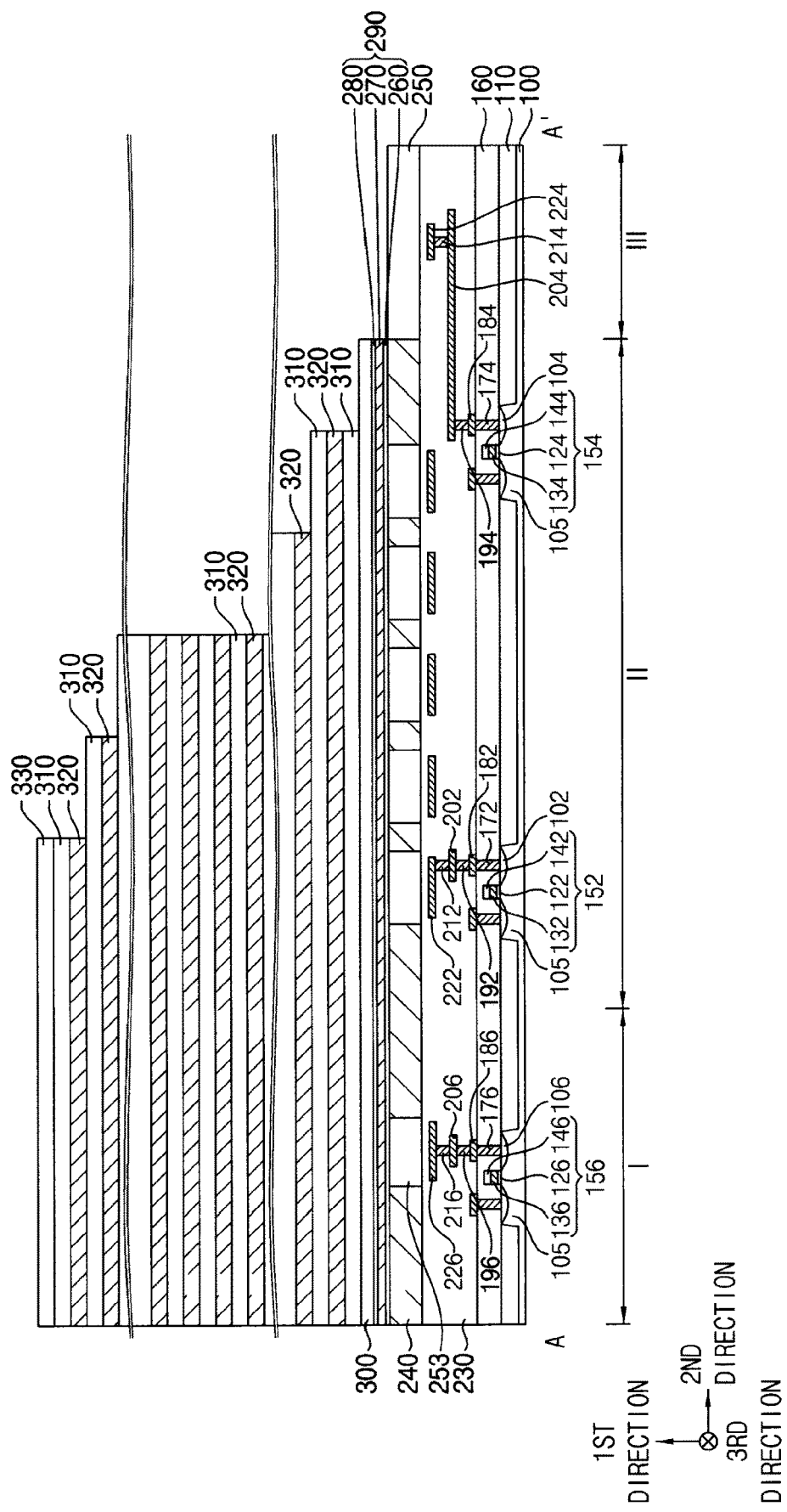
FIG. 4 illustrates a cross-sectional view taken along line A-A' in FIG. 1 further descriptive of the method of manufacturing the vertical memory device.

Referring to FIG. 4, an etch stop layer 330 may be formed on an uppermost one of the insulation layers 310, a photoresist pattern (not shown) partially covering the etch stop layer 330 may be formed thereon, and the etch stop layer 330, the uppermost one of the insulation layers 310, and an uppermost one of the fourth sacrificial layers 320 thereunder may be etched using the photoresist pattern as an etching mask. Accordingly, a portion of one of the insulation layers 310 directly under the uppermost one of the fourth sacrificial layers 320 may be exposed.

After a trimming process for reducing an area of the photoresist pattern by a given ratio is performed, an etching process may be performed such that the etch stop layer 330, the uppermost one of the insulation layers 310, the uppermost one of the fourth sacrificial layers 320, the exposed one of the insulation layers 310 and one of the fourth sacrificial layers 320 thereunder may be etched using the reduced photoresist pattern as an etching mask. As the trimming process and the etching process are repeatedly performed, a mold including a plurality of step layers which may include the fourth sacrificial layer 320 and the insulation layer 310 sequentially stacked and having a staircase shape may be formed.

Hereinafter, each of the "step layers" may be considered to include not only an exposed portion, but also a portion thereof covered by upper step layers, and thus may refer to an entire portion of the fourth sacrificial layer 320 and an entire portion of the insulation layer 310 at each level. The exposed portion of the step layer not covered by upper step layers may be referred to as a "step." In example embodiments, the steps may be arranged in the second direction, and may be also arranged in the third direction.

The mold may be formed on the support layer 300 on the first and second regions I and II of the substrate 100, and an edge upper surface of the support layer 300 is not covered by the mold, but is exposed. The steps in the mold may be formed on the second region II of the substrate 100.

Figure 5:
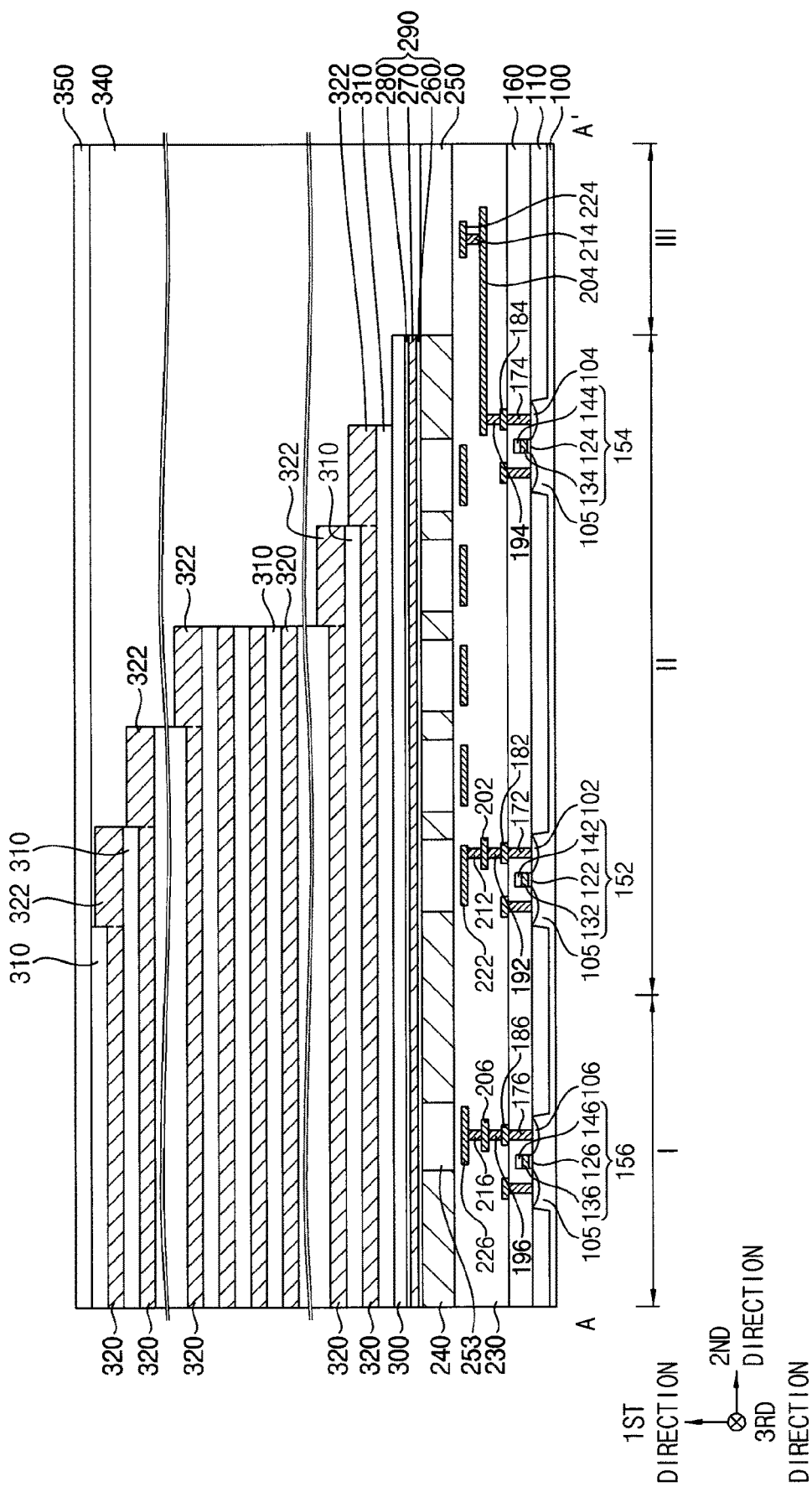
FIG. 5 illustrates a cross-sectional view taken along line A-A' in FIG. 1 further descriptive of the method of manufacturing the vertical memory device.

Referring to FIG. 5, a thickness of an end portion in the second direction of each of the fourth sacrificial layers 320 may be increased to form an insulation pad layer 322.

In one embodiment, the insulation pad layer 322 may be formed by removing an end portion in the second direction of the insulation layer 310 not covered by upper step layers included in each of the step layers to expose an end portion in the second direction of the fourth sacrificial layer 320 in each of the step layers. Thereafter, a pad layer may be formed on the etch stop layer 330, the mold, the support layer 300 and the third insulation pattern 250. Thereafter, portions of the pad layer on a sidewall of the mold, upper surfaces of the etch stop layer 330, the support layer 300, and the third insulating interlayer pattern 250 may be removed. The pad layer may include a material substantially the same as that of the fourth sacrificial layer 320, and thus may be merged to the fourth sacrificial layer 320 to form the insulation pad layer 322. An end portion in the second direction of each of the fourth sacrificial layers 320 where the insulation pad layer 322 is formed may have a thickness greater than that of other portions thereof.

A fifth insulating interlayer 340 may be formed on the third insulating interlayer pattern 250 and the support layer 300, to cover the mold and the exposed upper surfaces of the etch stop layer 330, the support layer 300 and the third insulating interlayer pattern 250, and a sidewall of the sacrificial layer structure 290. The fifth insulating layer 340 may be planarized until an upper surface of the uppermost one of the insulation layers 310 is exposed. Thus, the etch stop layer 330 may be removed, and a sidewall of the mold may be covered by the fifth insulating interlayer 340. The fifth insulating interlayer 340 may include an oxide, such as for example silicon oxide.

A sixth insulating interlayer 350 may be formed on an upper surface of the mold and an upper surface of the fifth insulating interlayer 340. The sixth insulating interlayer 350 may include an oxide, such as for example silicon oxide.

Figure 6:
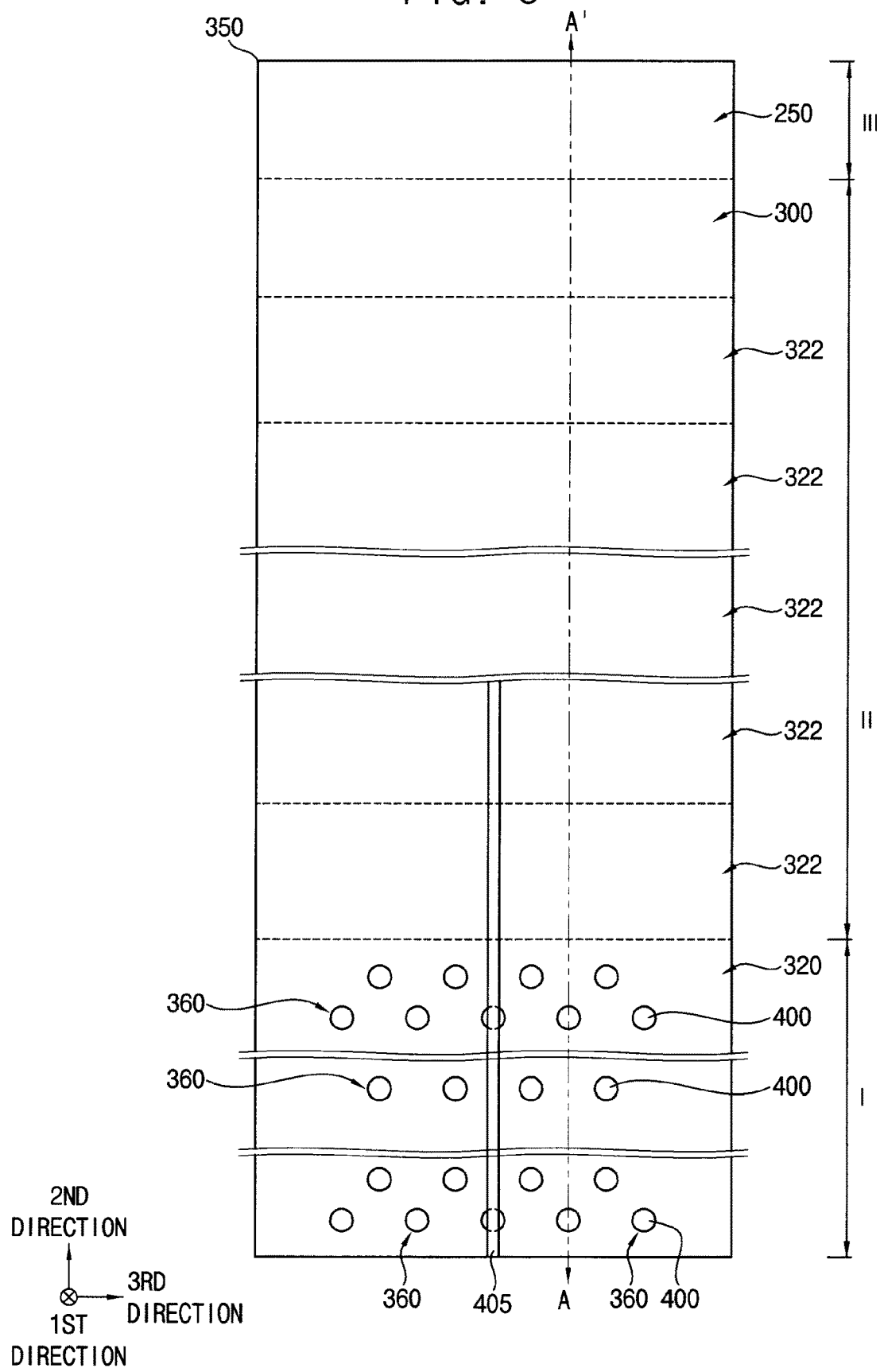
FIG. 6 illustrates a plan view further descriptive of the method of manufacturing a vertical memory device.
Figure 7:
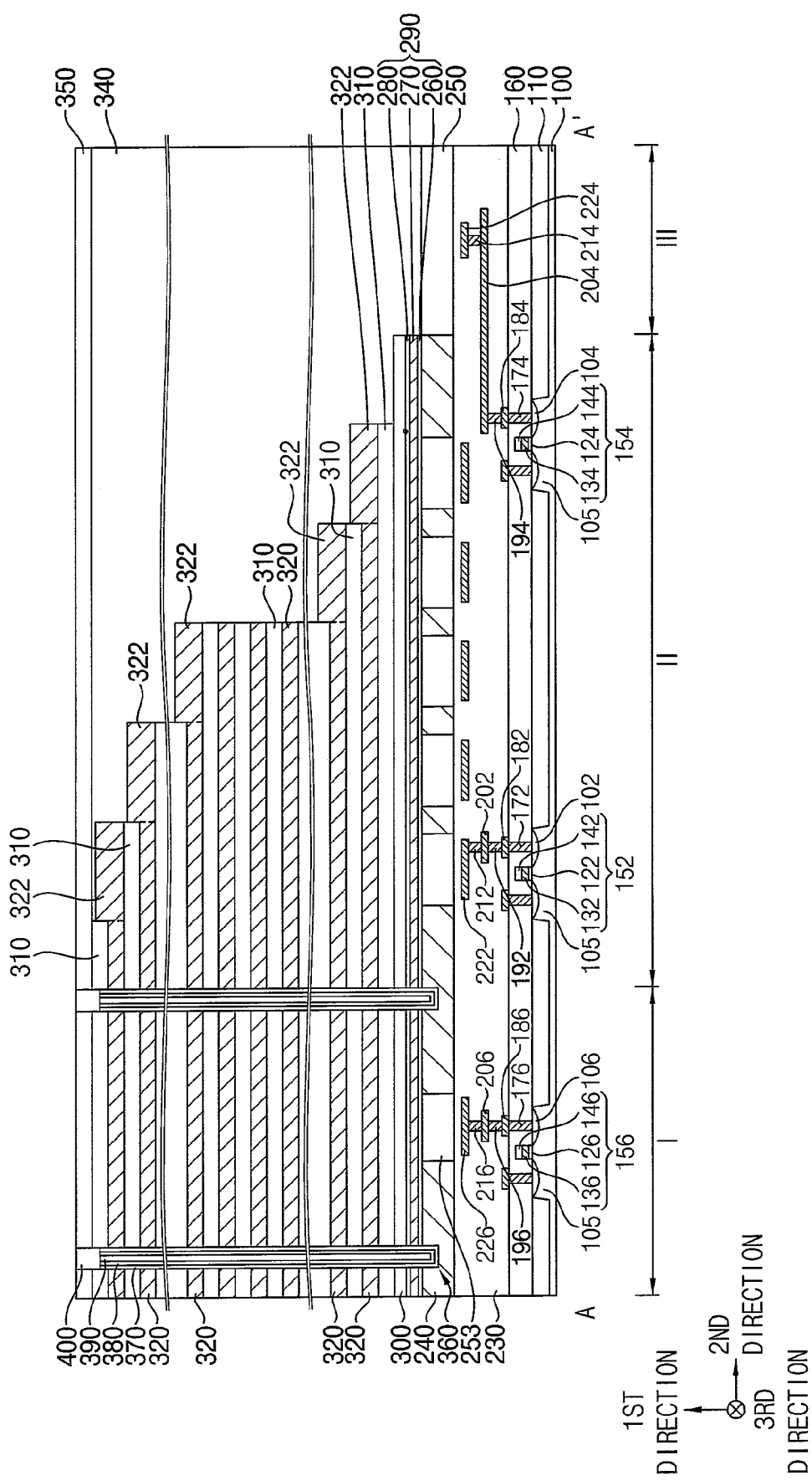
FIG. 7 illustrates a cross-sectional view taken along line A-A' in FIG. 6 descriptive of the method of manufacturing the vertical memory device.
Figure 8:
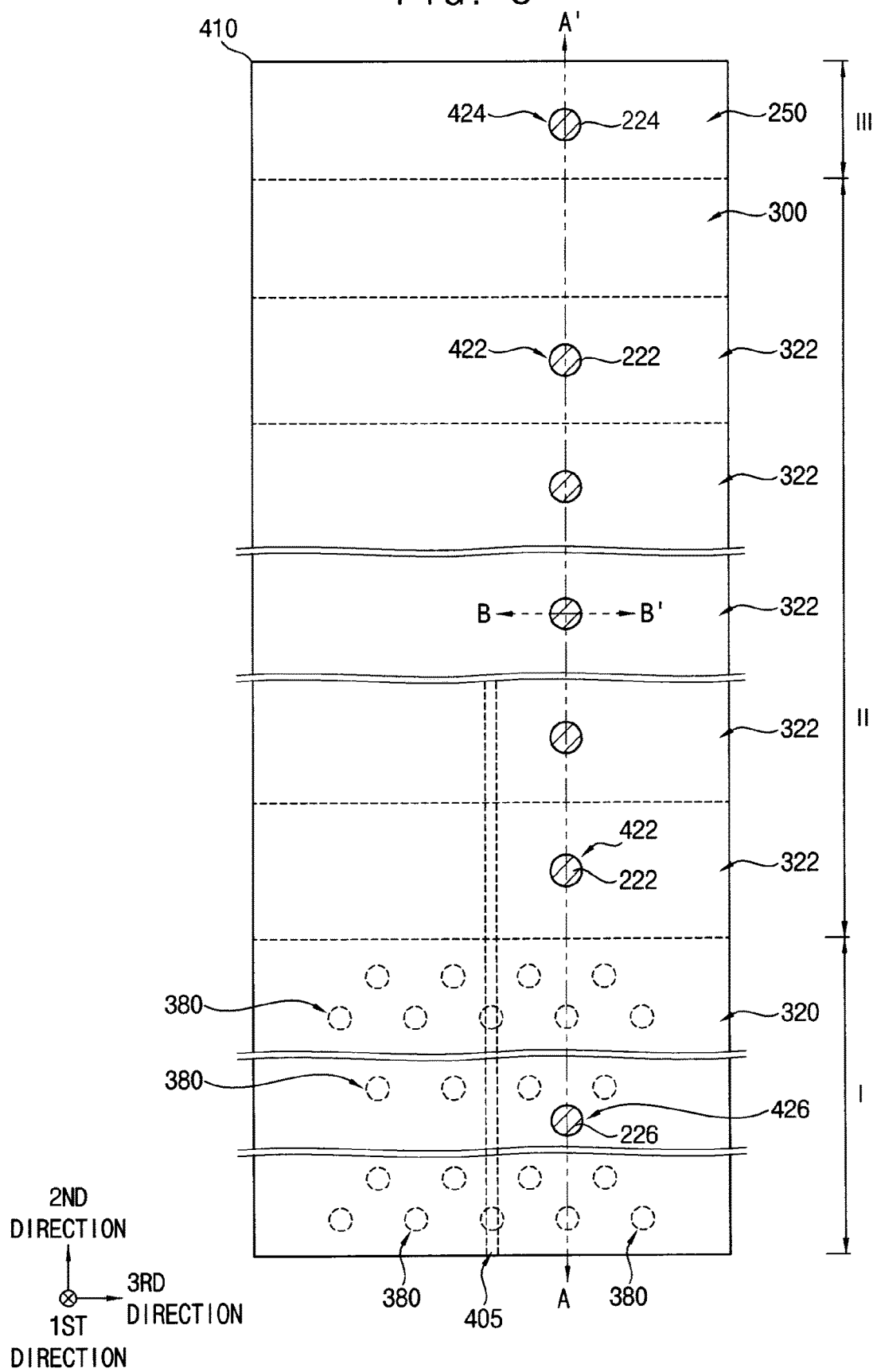
FIG. 8 illustrates a plan view further descriptive of the method of manufacturing a vertical memory device.
Figure 9:
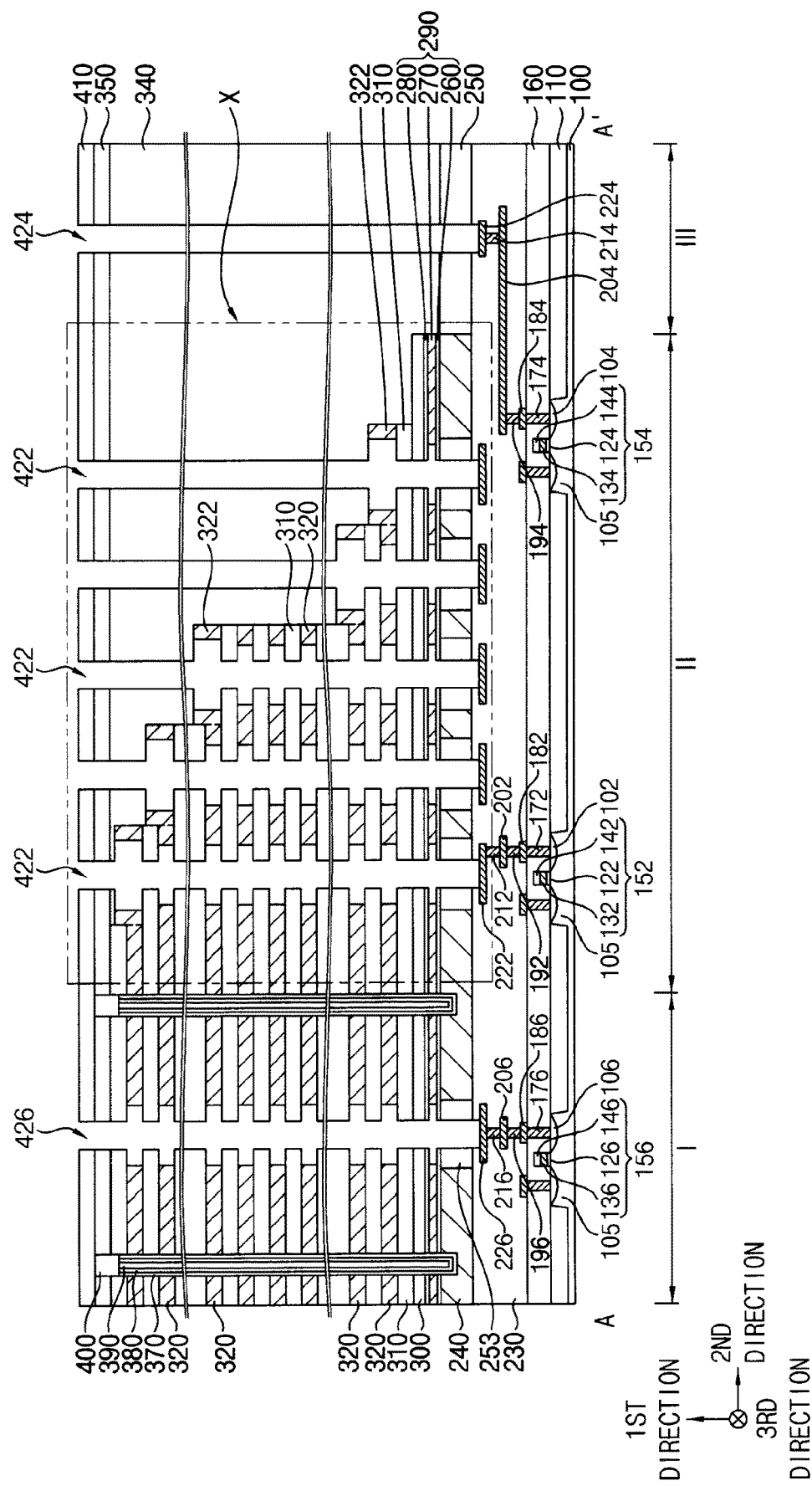
FIG. 9 illustrates a cross-sectional view taken along line A-A' in FIG. 8 descriptive of the method of manufacturing the vertical memory device.
Figure 10:
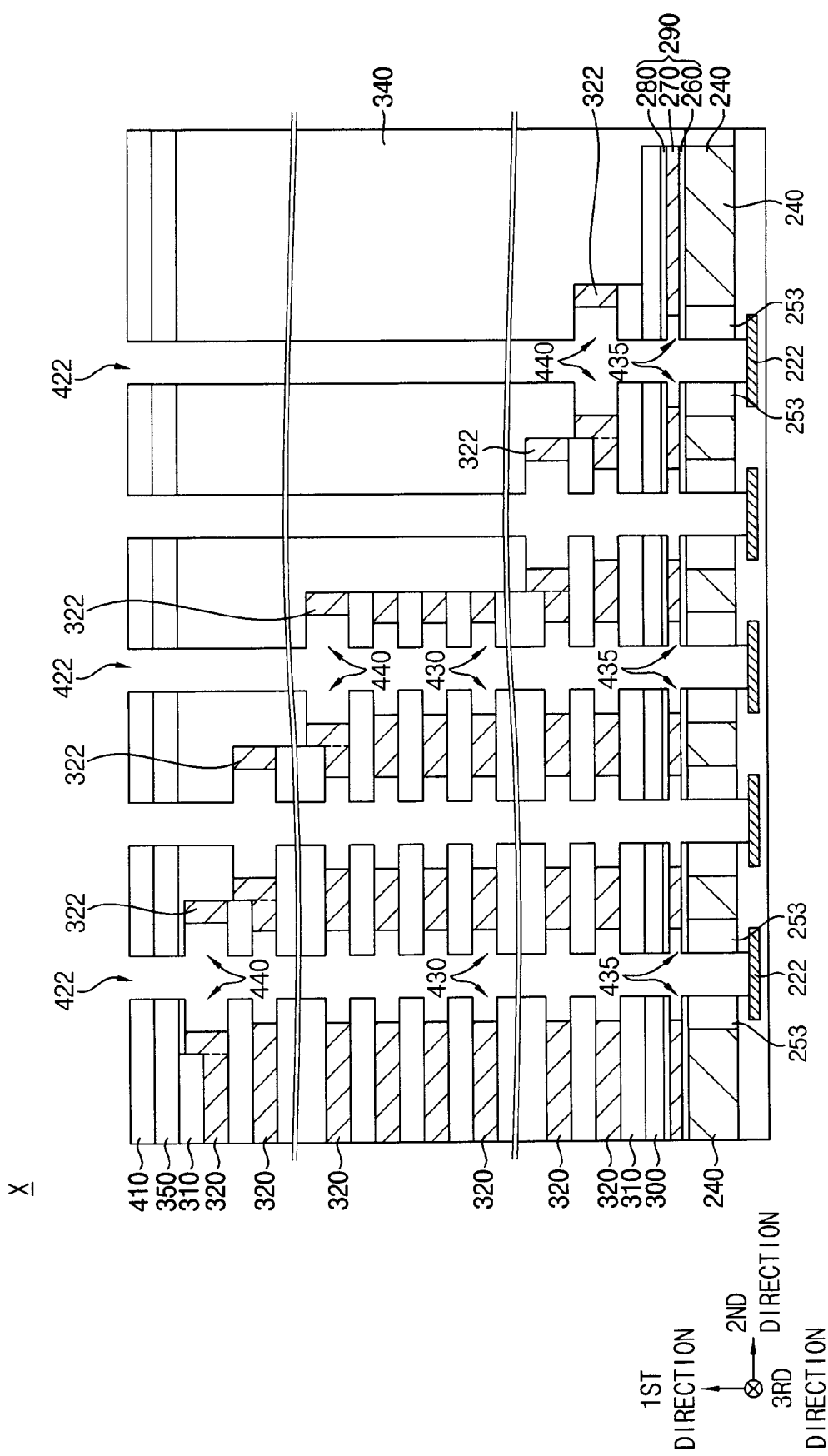
FIG. 10 illustrates an enlarged cross-sectional view of region X of FIG. 9.
Figure 11:
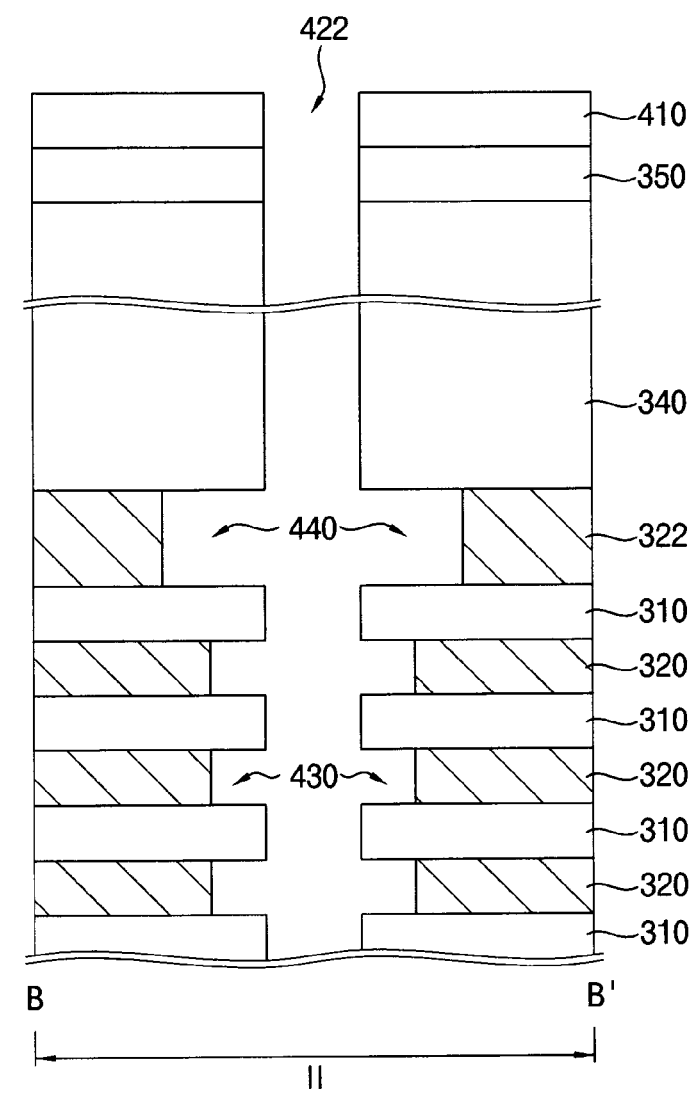
FIG. 11 illustrates a cross-sectional view taken along line B-B' in FIG. 8 descriptive of the method of manufacturing the vertical memory device.

Referring to FIGS. 6 and 7, after forming an etching mask (not shown) on an upper surface of the sixth insulating interlayer 350, the sixth insulating interlayer 350, the insulation layers 310, the fourth sacrificial layers 320, the support layer 300 and the sacrificial layer structure 290 may be etched using the etching mask to form a channel hole 360 therethrough exposing an upper surface of the CSP 240 on the first region I of the substrate 100.

In example embodiments, a plurality of channel holes 360 may be formed to be spaced apart from each other in each of the second and third directions.

After removing the etching mask, a charge storage structure layer and a channel layer may be formed on sidewalls of the channel holes 360 and the upper surfaces of the CSP 240 and the sixth insulating interlayer 350, and a first filling layer may be formed on the channel layer to fill the channel holes 360. The first filling layer, the channel layer and the charge storage structure layer may be planarized until the upper surface of the sixth insulating interlayer 350 is exposed to form a charge storage structure 370, a channel 380 and a first filling pattern 390 sequentially stacked in each of the channel holes 360.

In example embodiments, the charge storage structure 370 may include a tunnel insulation pattern, a charge storage pattern and a first blocking pattern sequentially stacked in a horizontal direction substantially parallel to the upper surface of the substrate 100 from an outer sidewall of the channel 380. The tunnel insulation pattern may include an oxide, such as for example silicon oxide, the charge storage pattern may include a nitride, such as for example silicon nitride, and the first blocking pattern may include an oxide, such as for example silicon oxide.

An upper portion of a first pillar structure including the charge storage structure 370, the channel 380 and the first filling pattern 390 sequentially stacked in each of the channel holes 360 may be removed to form a first trench, and a first capping pattern 400 may be formed to fill the first trench. The first capping pattern 400 may include for example polysilicon doped with n-type impurities.

An etching mask (not shown) may be formed on the upper surface of the sixth insulating interlayer 350, and the sixth insulating interlayer 350, and upper ones of the insulation layers 310 and the fourth sacrificial layers 320 may be etched using the etching mask to form to a first opening therethrough, which may extend in the second direction. A first division pattern 405 may be formed in the first opening.

In an example embodiment, the first division pattern 405 may extend through upper portions of some of the channels 380. Additionally, the first division pattern 405 may extend through the sixth insulating interlayer 350, the fourth sacrificial layers 320 at the upper two levels, respectively, and the insulation layers 310 at the upper two levels respectively, and partially through one of the insulation layers 310 at a third level from above. The first division pattern 405 may extend in the second direction on the first and second regions I and II of the substrate 100, and may extend through step layers at the upper two levels respectively, in the mold. Accordingly, the fourth sacrificial layers 320 at the respective upper two levels may be divided in the third direction by the first division pattern 405.

Referring to FIGS. 8 to 11, a seventh insulating interlayer 410 may be formed on the sixth insulating interlayer 350, the first capping pattern 400 and the first division pattern 405. The fifth to seventh insulating interlayers 340, 350 and 410, the mold, the support layer 300, the sacrificial layer structure 290, the third and fourth insulating interlayer patterns 250 and 253, and an upper portion of the second insulating interlayer 230 may be etched using an etching mask to form first to third through holes 422, 424 and 426 exposing upper surfaces of the seventh to ninth lower wirings 222, 224 and 226, respectively.

In example embodiments, the first through hole 422 may extend through ones of the fourth sacrificial layers 320 in the mold, and particularly, may extend through the insulation pad layer 322 of an uppermost one of the fourth sacrificial layers 320 among the ones of the fourth sacrificial layers 320 through which the first through hole 422 extends. In example embodiments, the first to third through holes 422, 424 and 426 may have the same diameter.

The first through hole 422 may extend through the insulation pad layer 322 of a corresponding one of the fourth sacrificial layers 320, and the insulation pad layer 322 may have an area smaller than areas in which the second and third through holes 424 and 426 may be formed. Thus, if other structures such as for example dummy channels are formed in the insulation pad layer 322, the first through hole 422 has to be spaced apart from the dummy channels and to thus have a relatively small diameter. However, in example embodiments, only the first through hole 422 is formed in the insulation pad 322, and other structures such as dummy channels are not formed therein, and thus the first through hole 422 may have a relatively large diameter, for example, a diameter substantially equal to that of the second and third through holes 424 and 426.

The first and third through holes 422 and 426 may extend through the fourth insulating interlayer pattern 253, and the second through hole 424 may extend through the third insulating interlayer pattern 250. The seventh insulating interlayer 410 may include an oxide, such as for example silicon oxide.

The fourth sacrificial layers 320 exposed by the first and third through holes 422 and 426 may be partially removed to form a first gap 430 by for example a wet etching process. In example embodiments, the insulation pad layer 322 having a thickness greater than that of other portions of the fourth sacrificial layers 320 may be etched at a relatively fast rate, and thus a second gap 440 may be formed in the insulation pad layer 322 to have a depth in the horizontal direction greater than that of the first gap 430. The second gap 440 may have a width in the first direction greater than that of the first gap 430.

The second sacrificial layer 270 including a material substantially the same as or similar to that of the fourth sacrificial layer 320 may be also partially removed to form a third gap 435.

Figure 12:
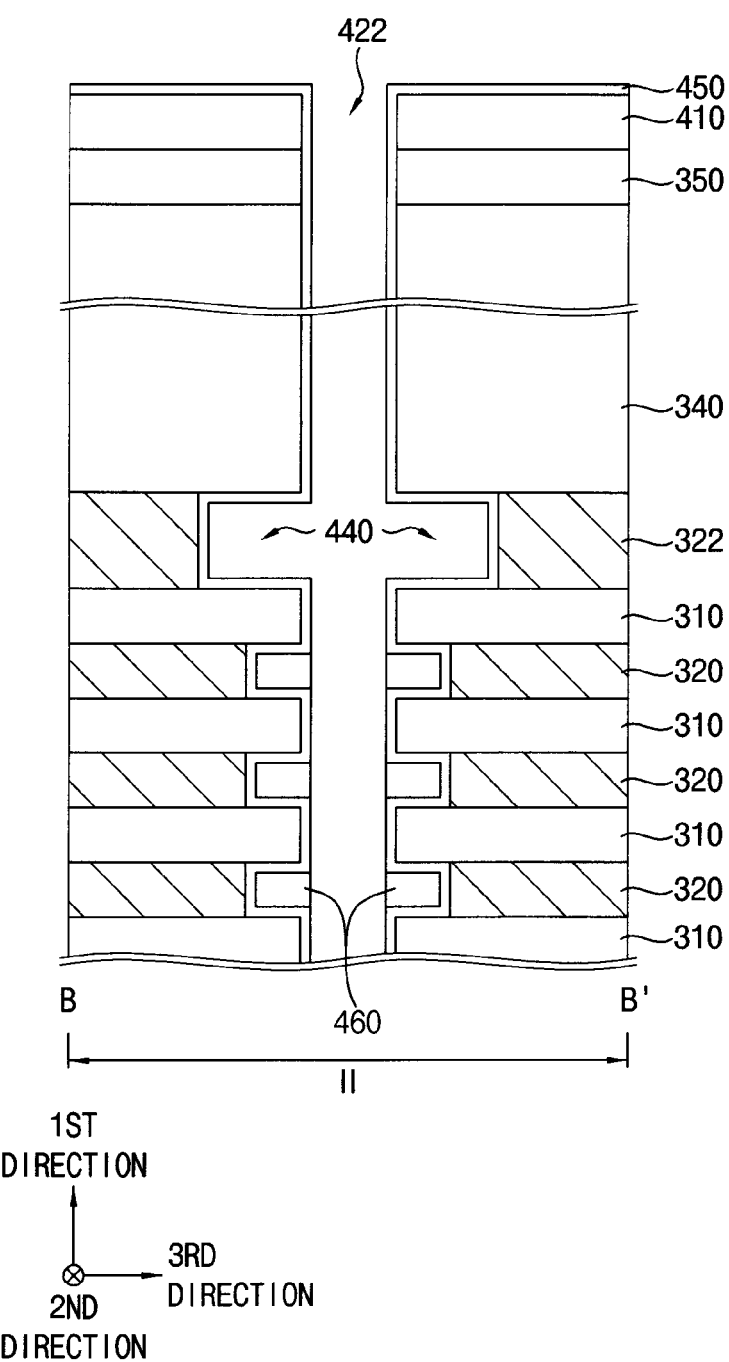
FIG. 12 illustrates a cross-sectional view taken along line B-B' in FIG. 8 further descriptive of the method of manufacturing the vertical memory device.

Referring to FIG. 12, a first spacer layer 450 may be formed on sidewalls of the first to third through holes 422, 424 and 426, the upper surfaces of the seventh to ninth lower wirings 222, 224 and 226 exposed by the first to third through holes 422, 424 and 426, respectively, inner walls of the first to third gaps 430, 440 and 435, and an upper surface of the seventh insulating interlayer 410. A second insulation layer may be formed on the first spacer layer 450 to fill the first and third gaps 430 and 435, and at least partially fill the second gap 440 and the first to third through holes 422, 424 and 426.

The second insulation layer may include an oxide such as for example silicon oxide, and the first spacer layer 450 may include a material having an etching selectivity with respect to the second insulation layer. The first spacer layer 450 may include a nitride such as for example silicon nitride.

The second insulation layer may be partially removed by for example a wet etching process, and thus a portion of the second insulation layer in the second gap 440 having a relatively large width in the first direction may be entirely removed, and a second insulation pattern 460 may be formed in each of the first and third gaps 430 and 435 having a relatively small width in the first direction.

During the wet etching process, the first insulation layer 310 of the mold may be protected by the first spacer layer 450 including the material having an etching selectivity with respect to the first insulation layer 310 and the second insulation pattern 460.

Figure 13:
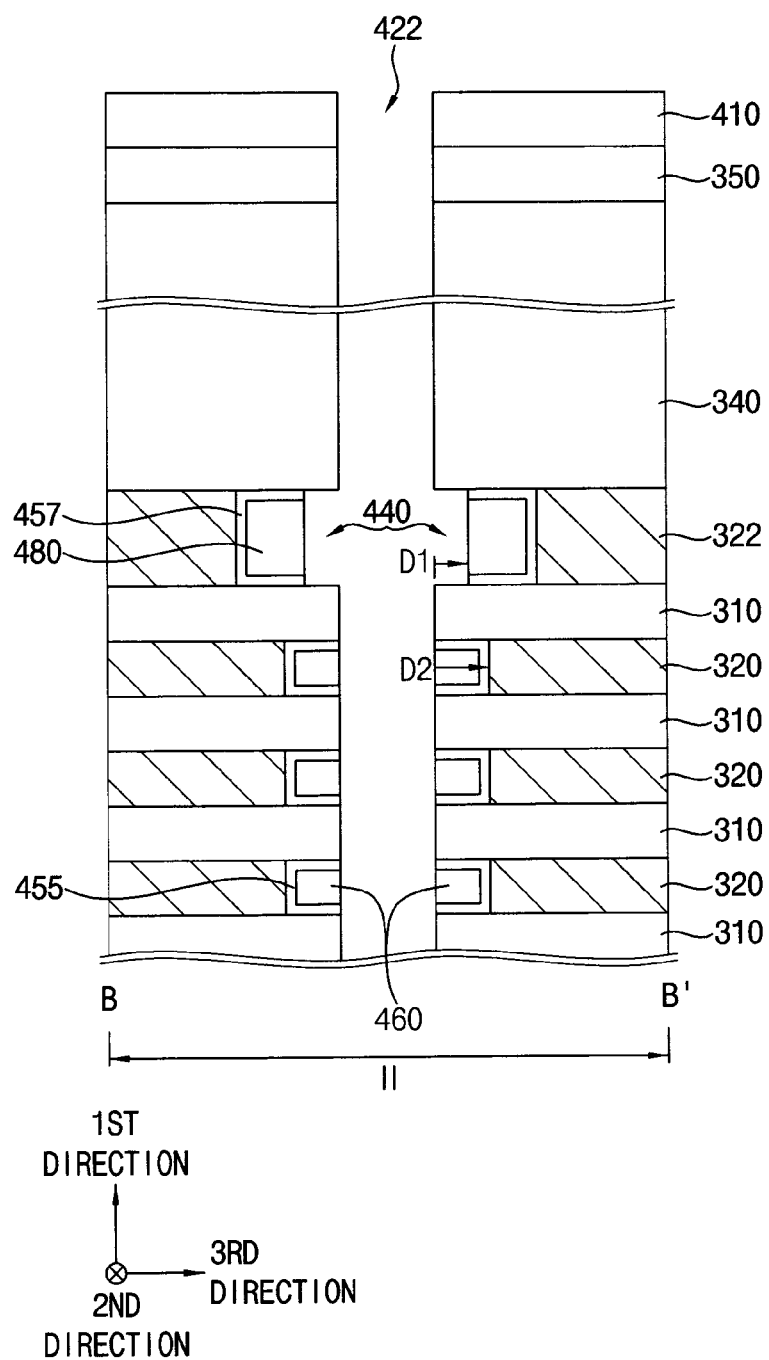
FIG. 13 illustrates a cross-sectional view taken along line B-B' in FIG. 8 further descriptive of the method of manufacturing the vertical memory device.

Referring to FIG. 13, a second filling layer may be formed on the first spacer layer 450 and the second insulation pattern 460 to fill the second gap 440 and at least partially fill the first to third through holes 422, 424 and 426. The second filling layer may then be partially removed by for example a wet etching process. The second filling layer may include a nitride such as for example a silicon nitride.

By the wet etching process, a second filling pattern 480 may be formed in the second gap 440 to partially fill the second gap 440. In example embodiments, a first distance D1 from a sidewall of the first through hole 422 to a sidewall of the second filling pattern 480 in the horizontal direction may be equal to or less than a second distance D2 from the sidewall of the first through hole 422 to a sidewall of the fourth sacrificial layer 320 facing the second insulation pattern 460 in the horizontal direction.

The first spacer layer 450 including a material substantially the same as or similar to the second filling layer may be partially removed, and particularly, portions of the first spacer layer 450 on the sidewalls of the first to third through holes 422, 424 and 426 and on the upper surface of the seventh insulating interlayer 410 may be removed. Thus, a first spacer 455 covering lower and upper surfaces of the second insulation pattern 460 and a sidewall of the second insulation pattern 460 facing the fourth sacrificial layer 320, and a second spacer 457 covering lower and upper surfaces of the second filling pattern 480 and a sidewall of the second filling pattern 480 facing the insulation pad layer 322 may be formed.

Figure 14:
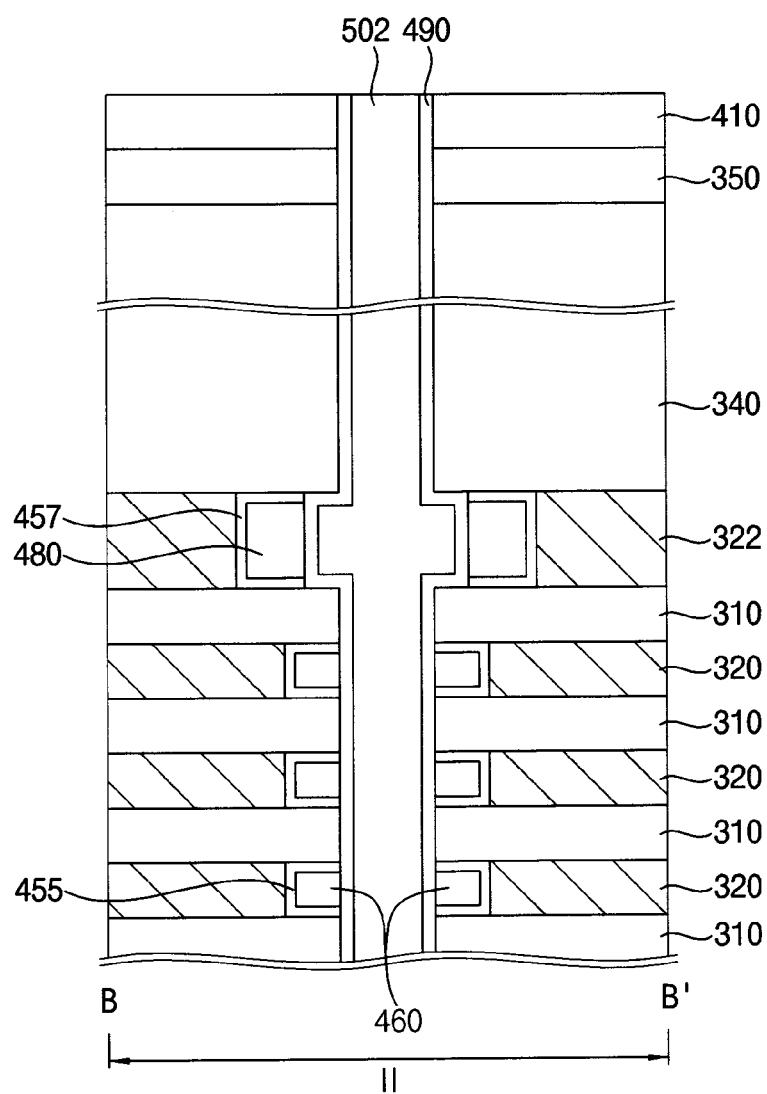
FIG. 14 illustrates a cross-sectional view taken along line B-B' in FIG. 8 further descriptive of the method of manufacturing the vertical memory device.
Figure 14:
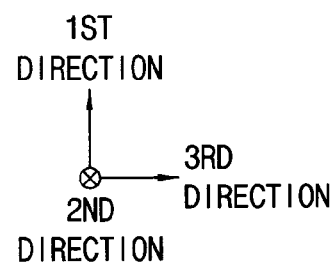

Referring to FIG. 14, a third spacer layer may be formed on sidewalls of the first to third through holes 422, 424 and 426, the upper surfaces of the seventh to ninth lower wirings 222, 224 and 226, the upper surface of the seventh insulating interlayer 410, and sidewalls of the second insulation pattern 460, the second filling pattern 480 and the first and second spacers 455 and 457. A fifth sacrificial layer may be formed on the third spacer layer to fill the first to third through holes 422, 424 and 426, and the fifth sacrificial layer and the third spacer layer may be planarized until the upper surface of the seventh insulating interlayer 410 is exposed.

Thus, a third spacer 490 may be formed on the sidewalls of the first to third through holes 422, 424 and 426, the upper surfaces of the seventh to ninth lower wirings 222, 224 and 226, and the sidewalls of the second insulation pattern 460, the second filling pattern 480 and the first and second spacers 455 and 457, and fifth to seventh sacrificial patterns 502, 504 and 506 (refer to FIG. 15) may be formed in remaining portions of the first to third through holes 422, 424 and 426, respectively.

The third spacer 490 may include a material having an etching selectivity with respect to the fourth sacrificial layer 320, such as for example an oxide such as silicon oxide, and the fifth to seventh sacrificial patterns 502, 504 and 506 may include for example polysilicon.

Figure 15:
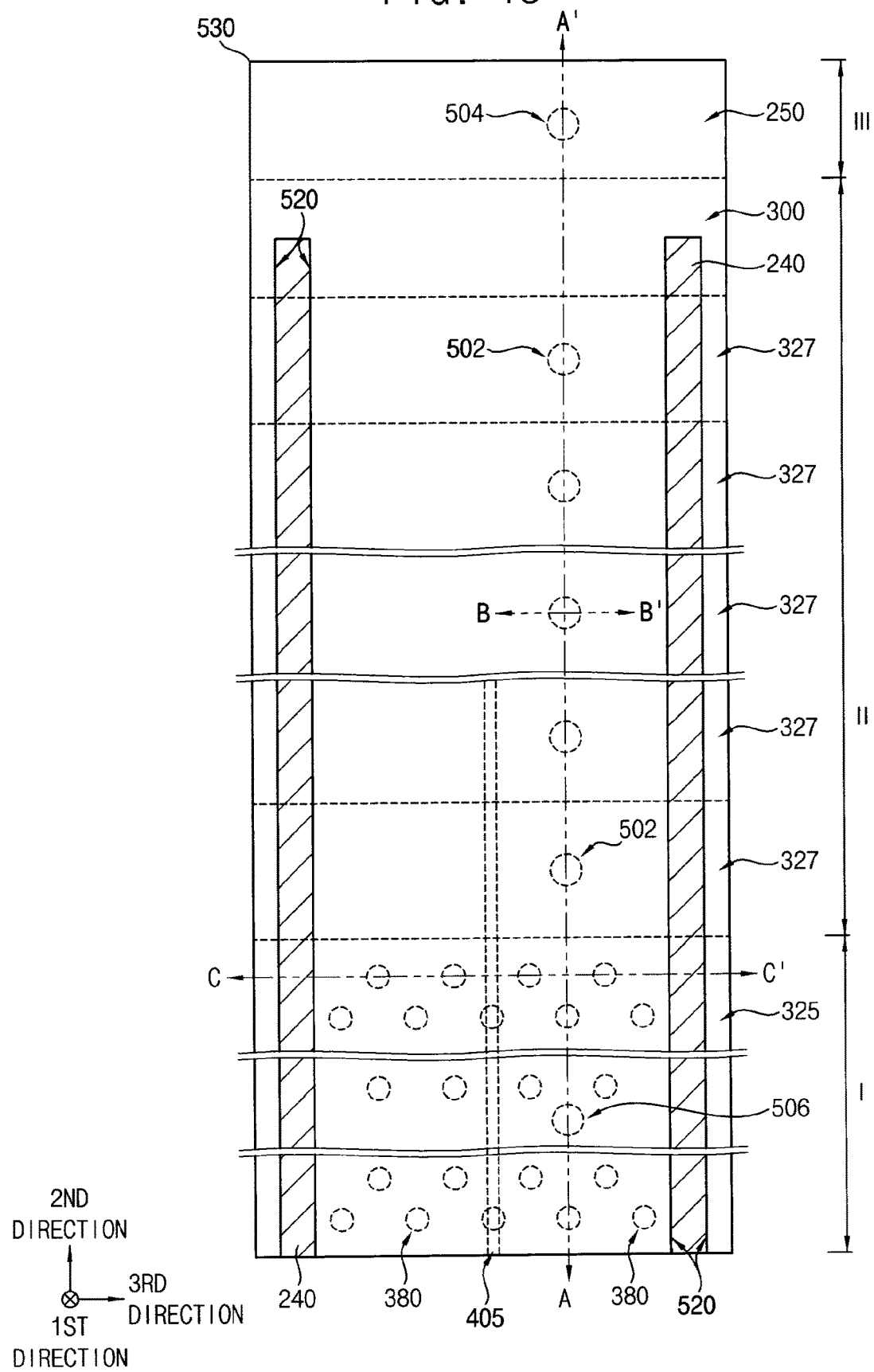
FIG. 15 illustrates a plan view further descriptive of the method of manufacturing a vertical memory device.
Figure 16:
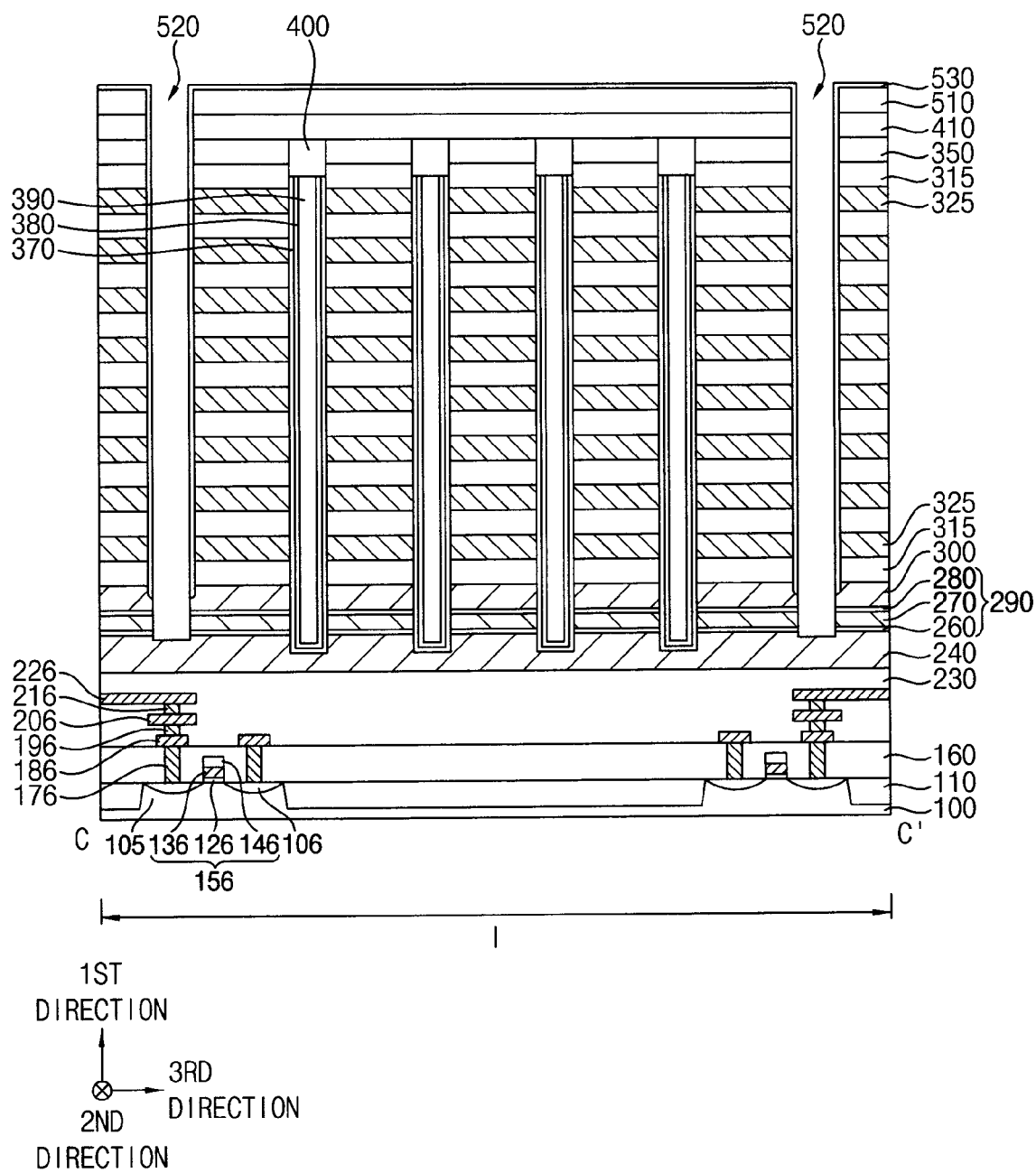
FIG. 16 illustrates a cross-sectional view taken along line C-C' in FIG. 15 descriptive of the method of manufacturing the vertical memory device.

Referring to FIGS. 15 and 16, an eighth insulating interlayer 510 may be formed on the seventh insulating interlayer 410, the fifth to seventh sacrificial patterns 502, 504 and 506, and the third spacer 490. A second opening 520 may be formed through the fifth to eighth insulating interlayers 340, 350, 410 and 510 and the mold on the first and second regions I and II of the substrate 100 by an etching process using an etching mask. The eighth insulating interlayer 510 may include an oxide such as for example silicon oxide.

The etching process may be performed until the second opening 520 exposes an upper surface of the support layer 300, and further the second opening 520 may extend through an upper portion of the support layer 300. As the second opening 520 is formed, the first insulation layers 310 and the fourth sacrificial layers 320 of the mold may be exposed.

In example embodiments, the second opening 520 may extend in the second direction on the first and second regions I and II of the substrate 100, and a plurality of second openings 520 may be formed to be spaced apart from each other in the third direction. As the second opening 520 is formed, the first insulation layer 310 may be divided into a plurality of first insulation patterns 315 each extending in the second direction, and the fourth sacrificial layer 320 may be divided into a plurality of fourth sacrificial patterns 325 each extending in the second direction. The insulation pad layer 322 at the end portion in the second direction of the fourth sacrificial layer 320 may be transformed into an insulation pad 327.

A fourth spacer layer may be formed on a sidewall and a bottom of the second opening 520 and an upper surface of the eighth insulating interlayer 510. The fourth spacer layer may be anisotropically etched to remove a portion of the fourth spacer layer on the bottom of the second opening 520. Thus, a fourth spacer 530 may be formed on the sidewall of the second opening 520, and an upper surface of the support layer 300 may be partially exposed.

The exposed portion of the support layer 300 and a portion of the sacrificial layer structure 290 thereunder may be removed to enlarge the second opening 520 downwardly. Thus, the second opening 520 may expose an upper surface of the CSP 240, and further may extend through an upper portion of the CSP 240.

In example embodiments, the fourth spacer 530 may include for example undoped polysilicon or undoped amorphous silicon.

When the sacrificial layer structure 290 is partially removed, the sidewall of the second opening 520 is covered by the fourth spacer 530, and thus the first insulation patterns 315 and the fourth sacrificial patterns 325 of the mold are not removed.

Figure 17:
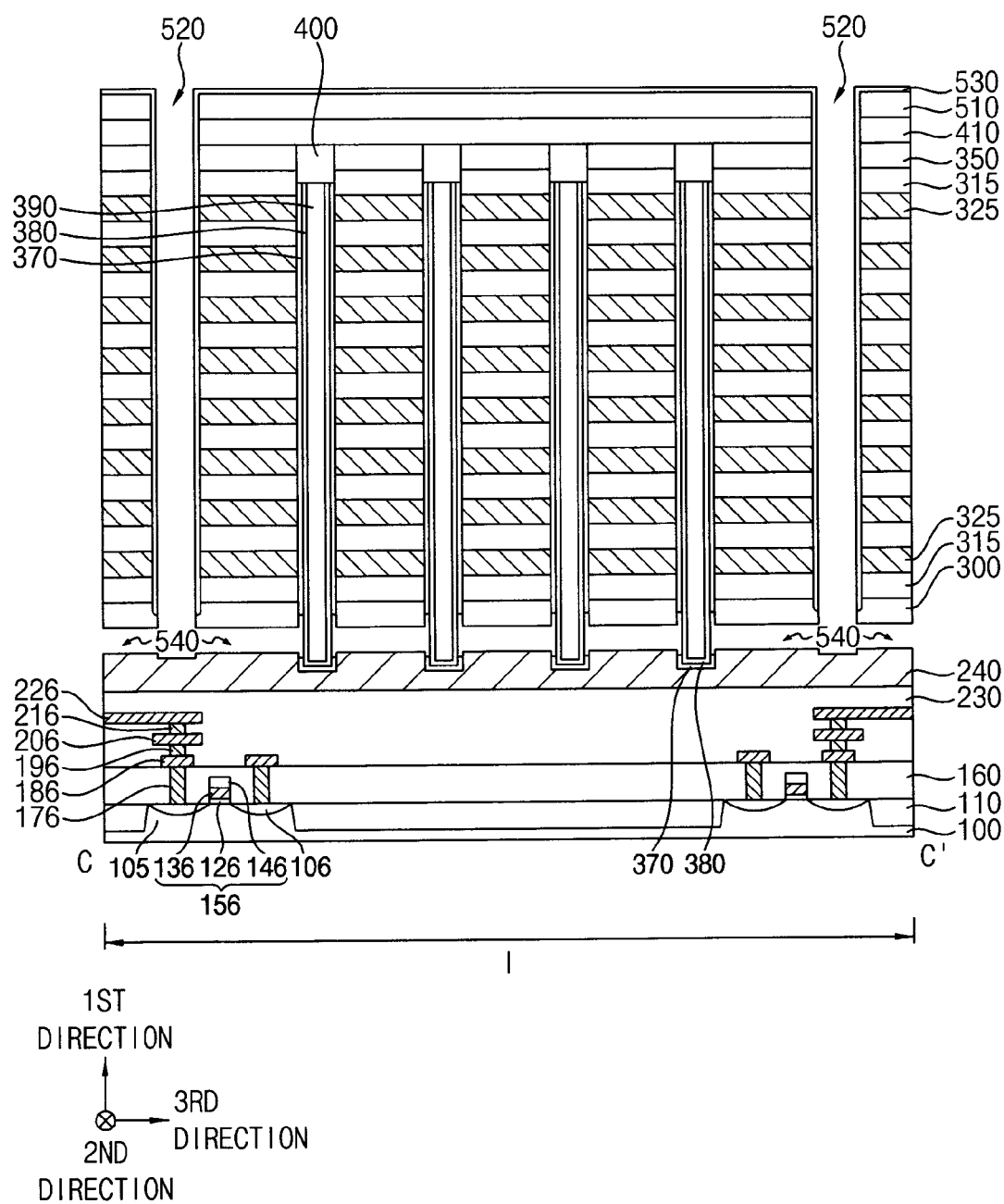
FIG. 17 illustrates a cross-sectional view taken along line C-C' in FIG. 15 further descriptive of the method of manufacturing the vertical memory device.

Referring to FIG. 17, the sacrificial layer structure 290 may be removed by for example a wet etching process through the second opening 520, and thus a fourth gap 540 may be formed. The wet etching process may be performed using for example hydrofluoric acid and/or phosphoric acid.

As the fourth gap 540 is formed, a lower surface of the support layer 300 and an upper surface of the CSP 240 may be exposed. Additionally, a portion of a sidewall of the charge storage structure 370 may be exposed, and the exposed portion of the sidewall of the charge storage structure 370 may also be removed during the wet etching process to expose a portion of an outer sidewall of the channel 380. Thus, the charge storage structure 370 may be divided into an upper portion extending through the mold to cover an upper portion of the outer sidewall of the channel 380, and a lower portion covering a bottom surface of the channel 380 on the CSP 240.

When the fourth gap 540 is formed by the wet etching process, the mold does not fall down due to the first pillar structure including the channel 380, the support layer 300 and the support pattern, and the fifth and seventh sacrificial patterns 502 and 506.

Figure 18:
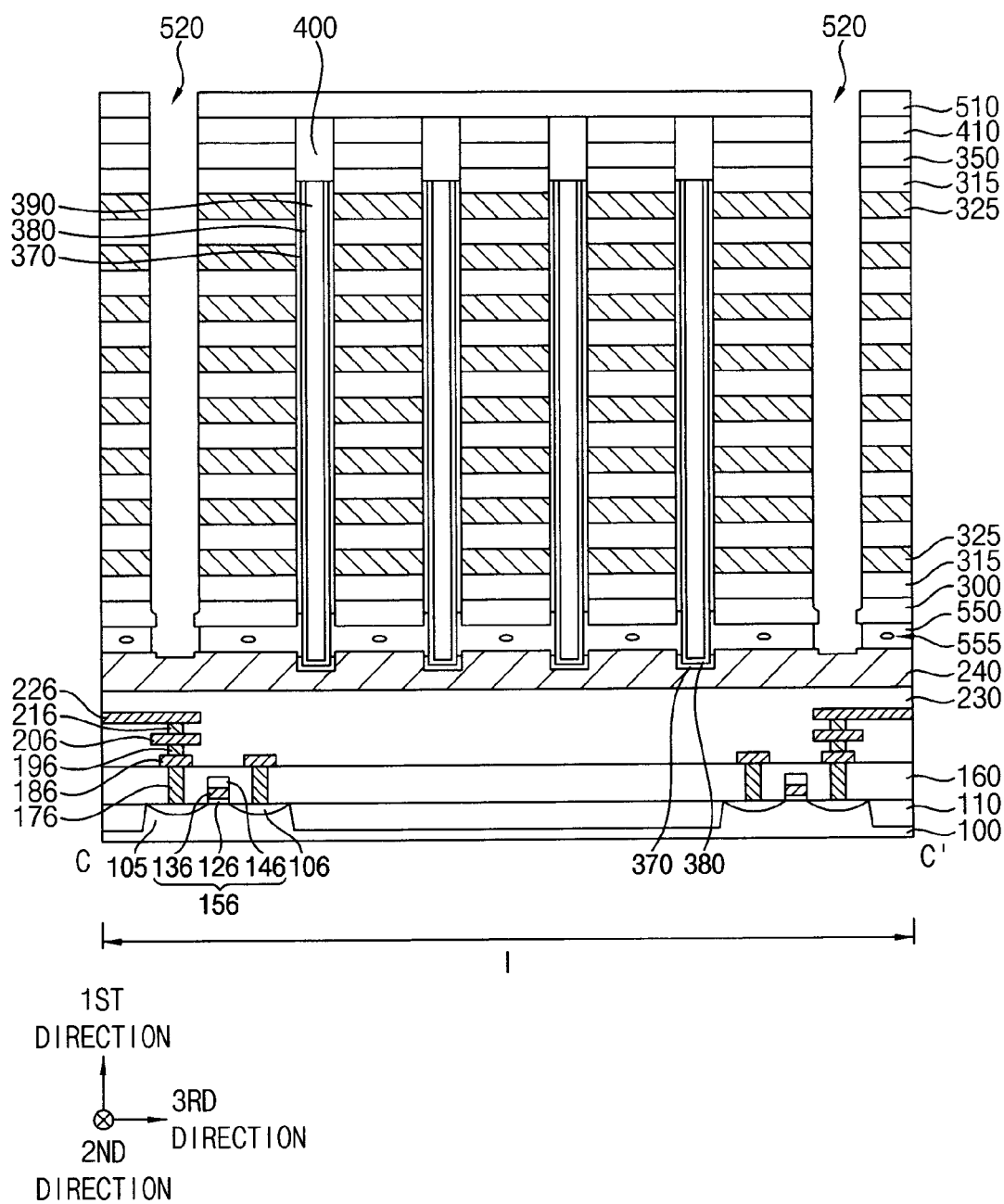
FIG. 18 illustrates a cross-sectional view taken along line C-C' in FIG. 15 further descriptive of the method of manufacturing the vertical memory device.

Referring to FIG. 18, the fourth spacer 530 may be removed, and a channel connection layer may be formed on the sidewall of the second opening 520 and in the fourth gap 540. A portion of the channel connection layer in the second opening 520 may then be removed by an etch back process to form a channel connection pattern 550 in the fourth gap 540.

As the channel connection pattern 550 is formed, the channels 380 between the second openings 520 neighboring in the third direction may be connected with each other.

The channel connection pattern 550 may include amorphous silicon doped with n-type impurities, which may be crystallized by heat generated during deposition processes for other structures to be converted into polysilicon doped with n-type impurities. An air gap 555 may be formed in the channel connection pattern 550.

Figure 19:
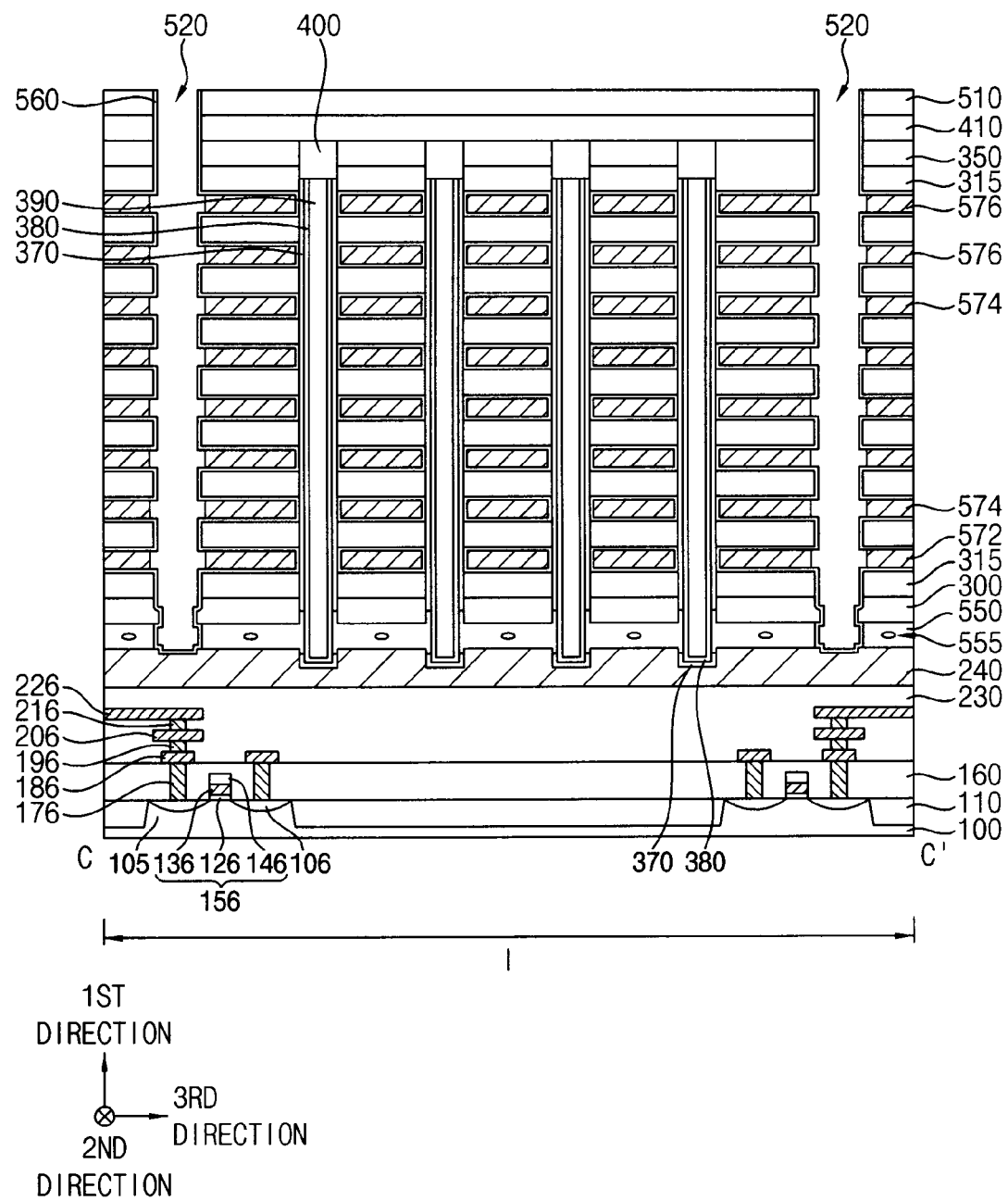
FIG. 19 illustrates a cross-sectional view taken along line C-C' in FIG. 15 further descriptive of the method of manufacturing the vertical memory device.
Figure 20:
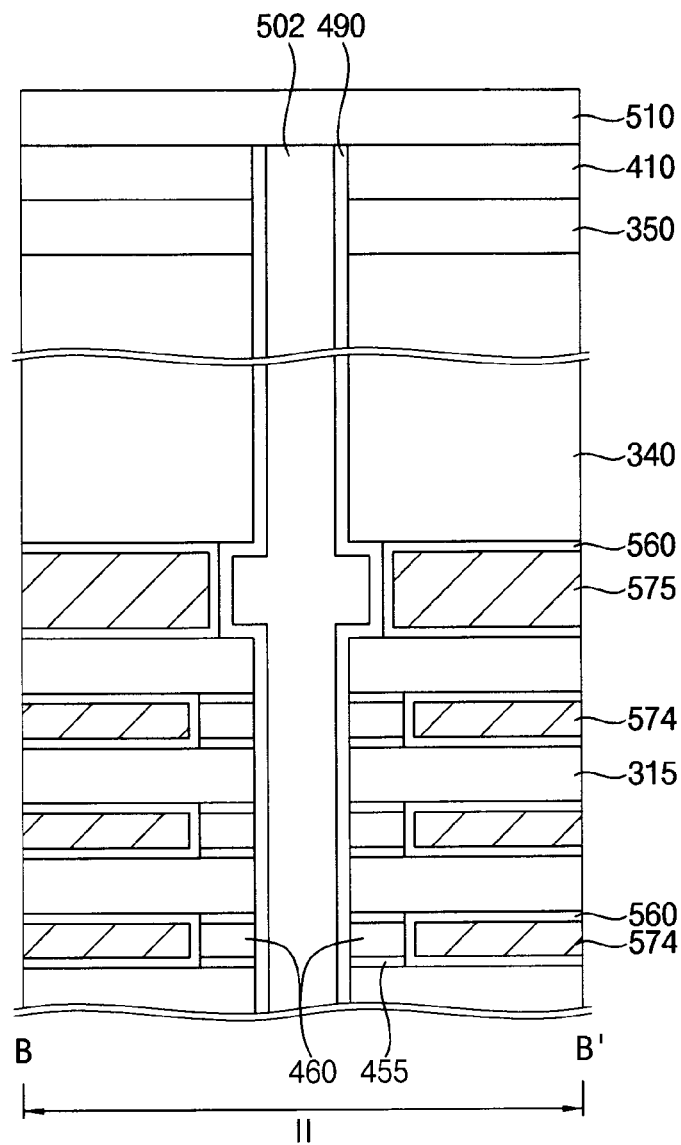
FIG. 20 illustrates a cross-sectional view taken along line B-B' in FIG. 15 descriptive of the method of manufacturing the vertical memory device.

Referring to FIGS. 19 and 20, the fourth sacrificial patterns 325 exposed by the second opening 520 may be removed to form a fifth gap between first insulation patterns 315 neighboring in the first direction. An outer sidewall of the charge storage structure 370 may be partially exposed by the fifth gap.

When the fourth sacrificial patterns 325 are removed, the second spacer 457 and the second filling pattern 480 including a material substantially the same as or similar to that of the fourth sacrificial patterns 325, and a sidewall of the first spacer 455 facing a sidewall of each of the fourth sacrificial patterns 325 may also be removed, and thus the first spacer 455 may remain only on lower and upper surfaces of the second insulation pattern 460.

As the fifth gap is formed, an outer sidewall of the third spacer 490, an outer sidewall of the second insulation pattern 460, and an end portion of the first spacer 455 adjacent thereto may be exposed.

In example embodiments, the fourth sacrificial patterns 325 may be removed by a wet etching process using phosphoric acid or sulfuric acid.

When the fourth sacrificial patterns 325 are removed to form the fifth gap, the fifth and seventh sacrificial patterns 502 and 506 have already been formed on the first and second regions I and II of the substrate 100, and thus the mold including the first insulation patterns 315 will not fall down even though dummy channels are not formed.

A second blocking layer may be formed on the exposed outer sidewall of the charge storage structure 370, the exposed outer sidewall of the third spacer 490, the exposed outer sidewall of the second insulation pattern 460, the exposed end portion of the first spacer 455, an inner wall of the fifth gap, a surface of the first insulation pattern 315, a sidewall of the support layer 300, a sidewall of the channel connection pattern 550, an upper surface of the CSP 240, and an upper surface of the eighth insulating interlayer 510. A gate electrode layer may then be formed on the second blocking layer.

The second blocking layer may include a metal oxide, such as for example aluminum oxide. The gate electrode layer may include a gate barrier layer and a gate conductive layer sequentially stacked. The gate barrier layer may include a metal nitride, and the gate conductive layer may include a metal.

The gate electrode layer may be partially removed to form a gate electrode in each of the fifth gaps. In example embodiments, the gate electrode layer may be partially removed by a wet etching process.

In example embodiments, the gate electrode may extend in the second direction, and a plurality of gate electrodes may be stacked in the first direction to form a gate electrode structure. The gate electrode structure may have a staircase shape having the gate electrodes as step layers, respectively, and a step of each of the step layers that is not overlapped by upper step layers, that is, an end portion in the second direction of each of the step layers may be referred to as a conductive pad. The mold including the first insulation patterns 315 and the fourth sacrificial patterns 325 may be converted into a mold including the first insulation patterns 315 and the gate electrodes.

In example embodiments, a plurality of gate electrode structures may be formed to be spaced apart from each other in the third direction by the second opening 520. The gate electrode structure may include first, second and third gate electrodes 572, 574 and 576 sequentially stacked in the first direction. In example embodiments, the first gate electrode 572 may be formed at a lowermost level, and may serve as a ground selection line (GSL). The third gate electrode 576 may be formed at an uppermost level and a second level from above, and may serve as a string selection line (SSL). The second gate electrode 574 may be formed at a plurality of levels between the first and third gate electrodes 572 and 576, and may serve as a word line. The conductive pads of the first to third gate electrodes 572, 574 and 576 may be referred to as first to third conductive pads 573, 575 and 577, respectively (refer to FIG. 22).

Figure 21:
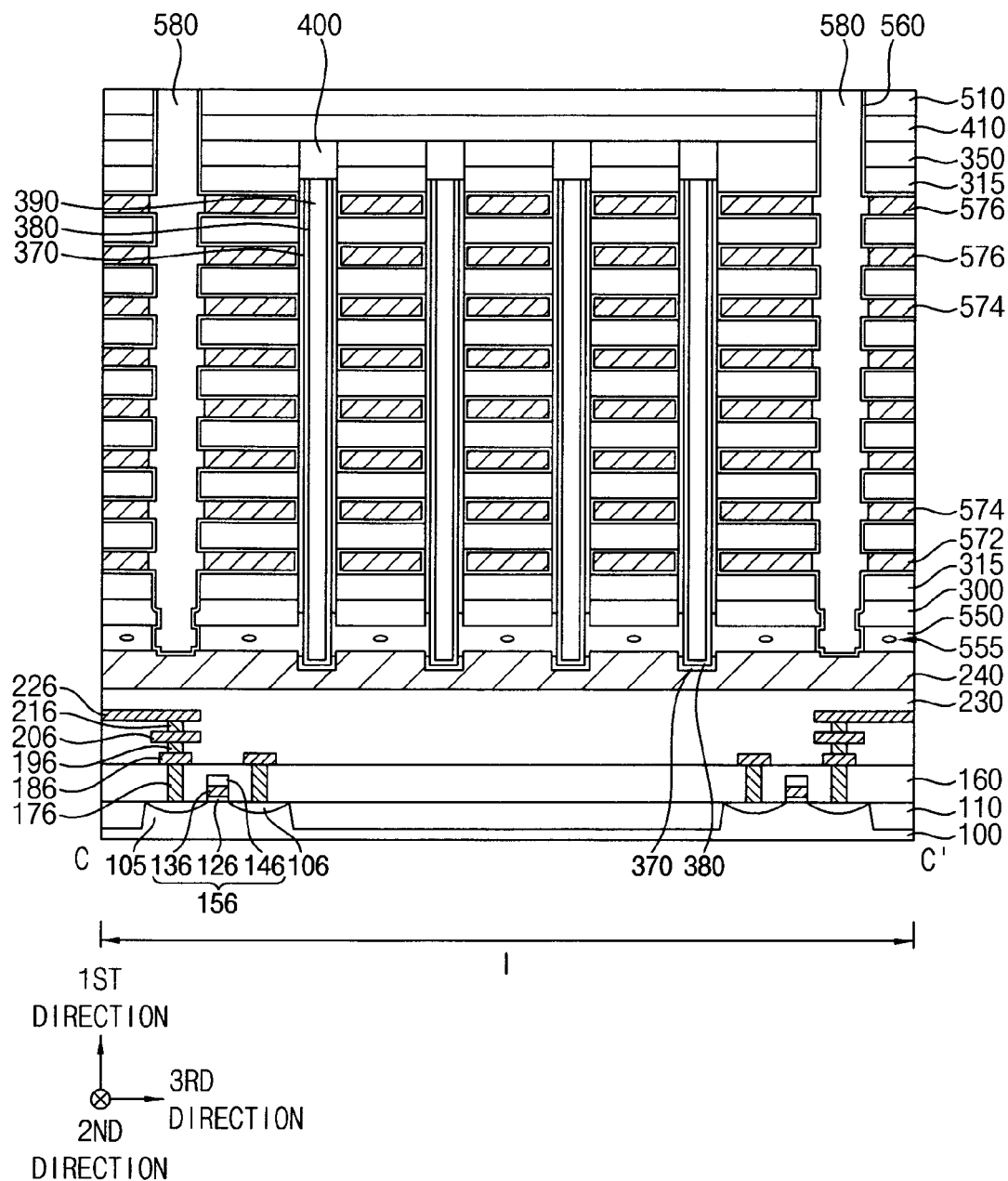
FIG. 21 illustrates a cross-sectional view taken along line C-C' in FIG. 15 further descriptive of the method of manufacturing the vertical memory device.

Referring to FIG. 21, a second division layer may be formed on the second blocking layer to fill the second opening 520, and the second division layer and the second blocking layer may be planarized until the upper surface of the eighth insulating interlayer 510 is exposed to form a second division pattern 580 and a second blocking pattern 560 (see also FIGS. 19 and 20), respectively. The second division pattern 580 may divide each of the first to third gate electrodes 572, 574 and 576 in the third direction, and may include an oxide such as for example silicon oxide.

Figure 22:
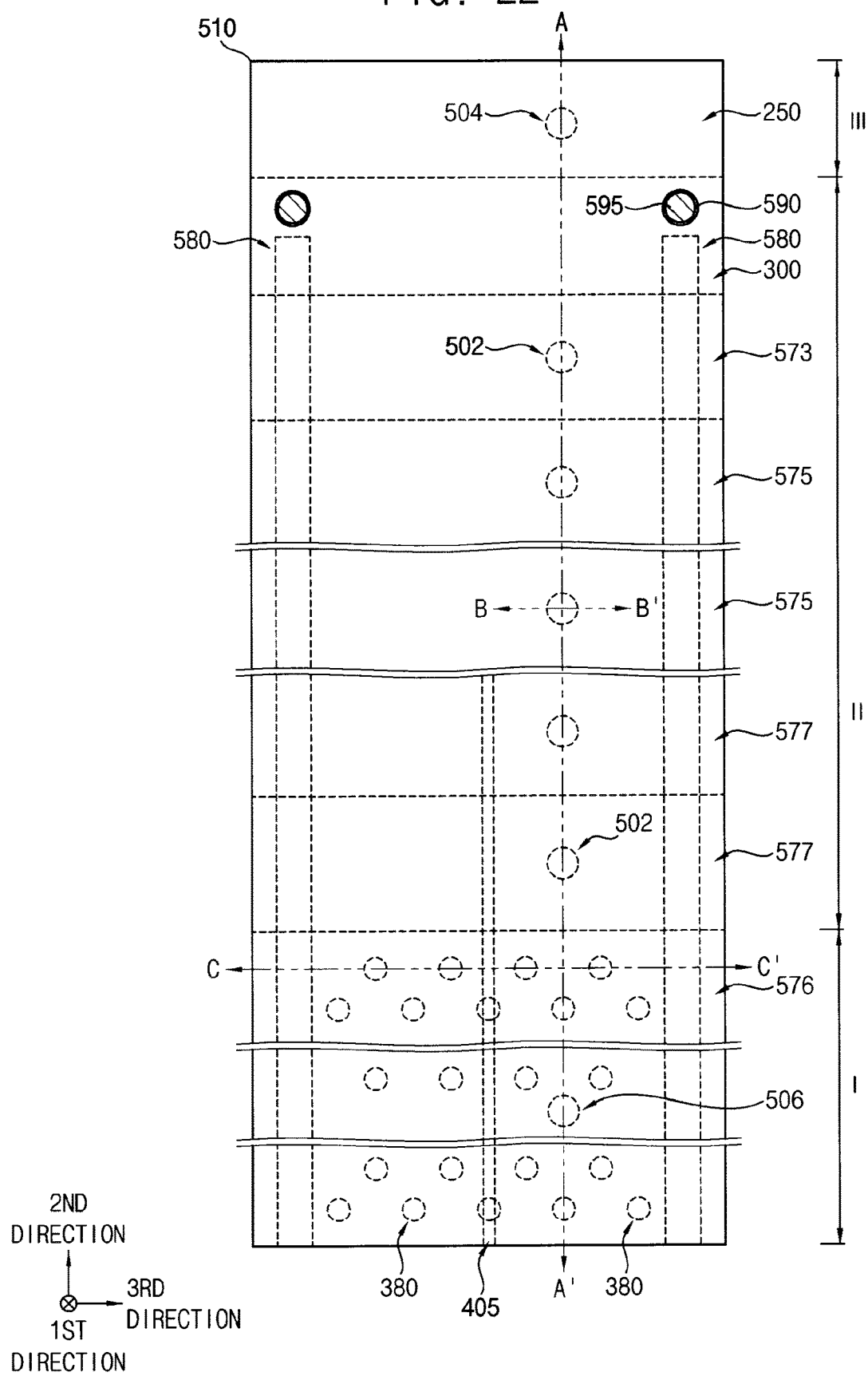
FIG. 22 illustrates a plan view further descriptive of the method of manufacturing a vertical memory device.
Figure 23:
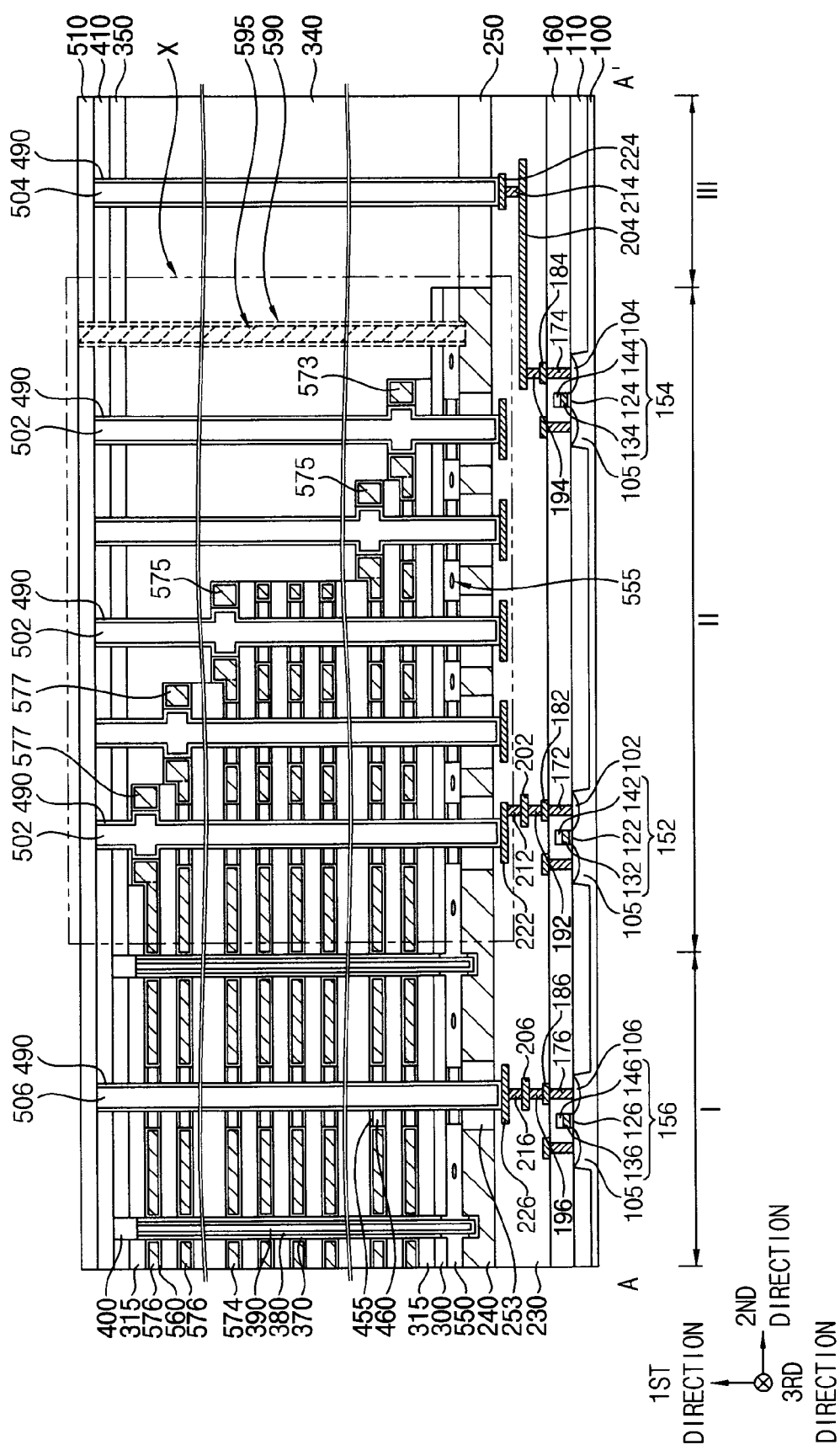
FIG. 23 illustrates a cross-sectional view taken along line A-A' in FIG. 22 descriptive of the method of manufacturing the vertical memory device.
Figure 24:
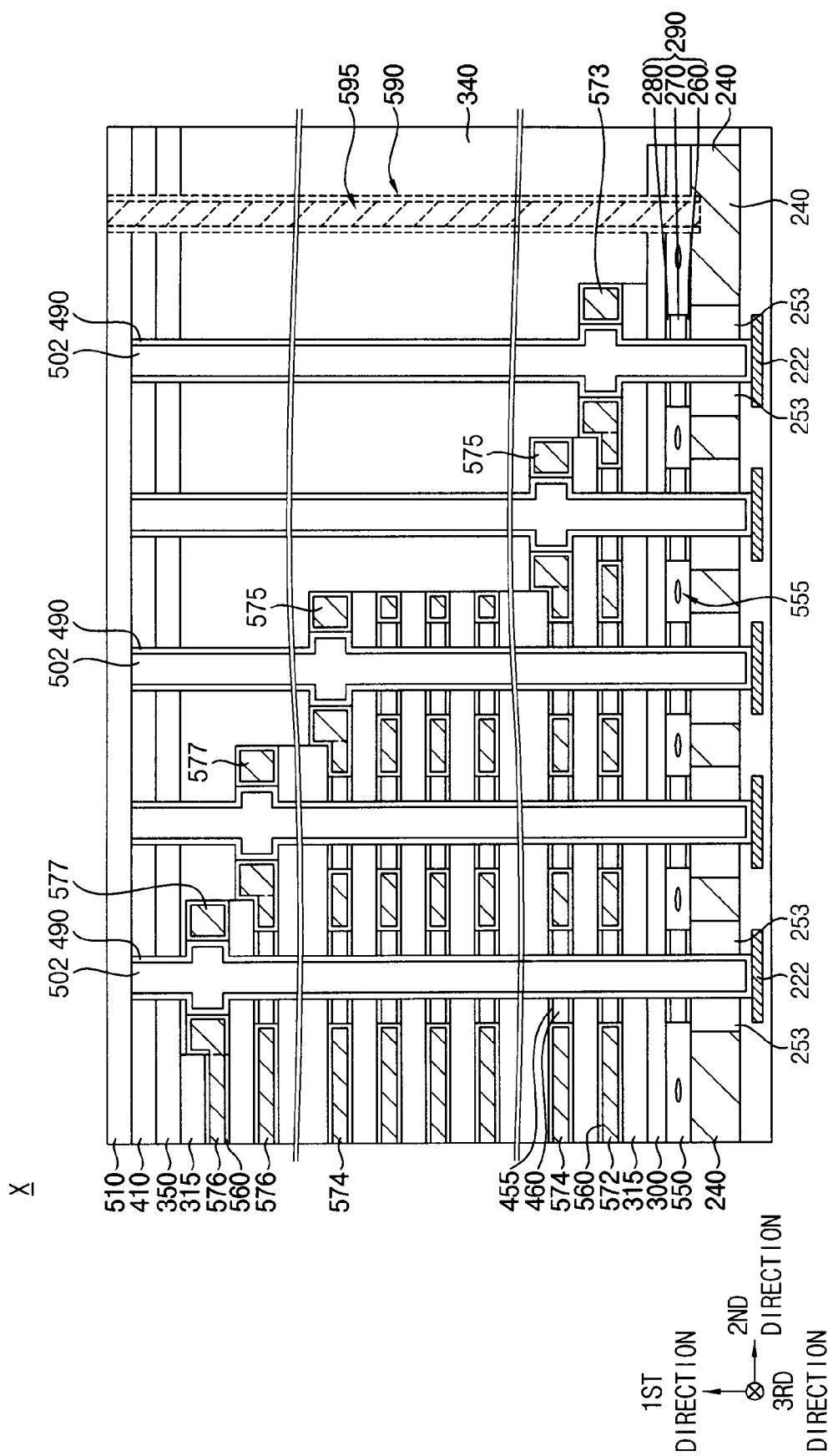
FIG. 24 illustrates an enlarged cross-sectional view of region X of FIG. 23.

Referring to FIGS. 22 to 24, a fourth through hole may be formed through the fifth to eighth insulating interlayers 340, 350, 410 and 510, the support layer 300 and the channel connection pattern 550 to expose an upper surface of the CSP 240. A fifth spacer 590 may be formed on a sidewall of the fourth through hole, and a first upper contact plug 595 may be formed to fill the fourth through hole.

The fifth spacer 590 may include an insulating material such as for example an oxide or a nitride, and the first upper contact plug 595 may include a metal, a metal nitride, a metal silicide, or doped polysilicon.

Figure 25:
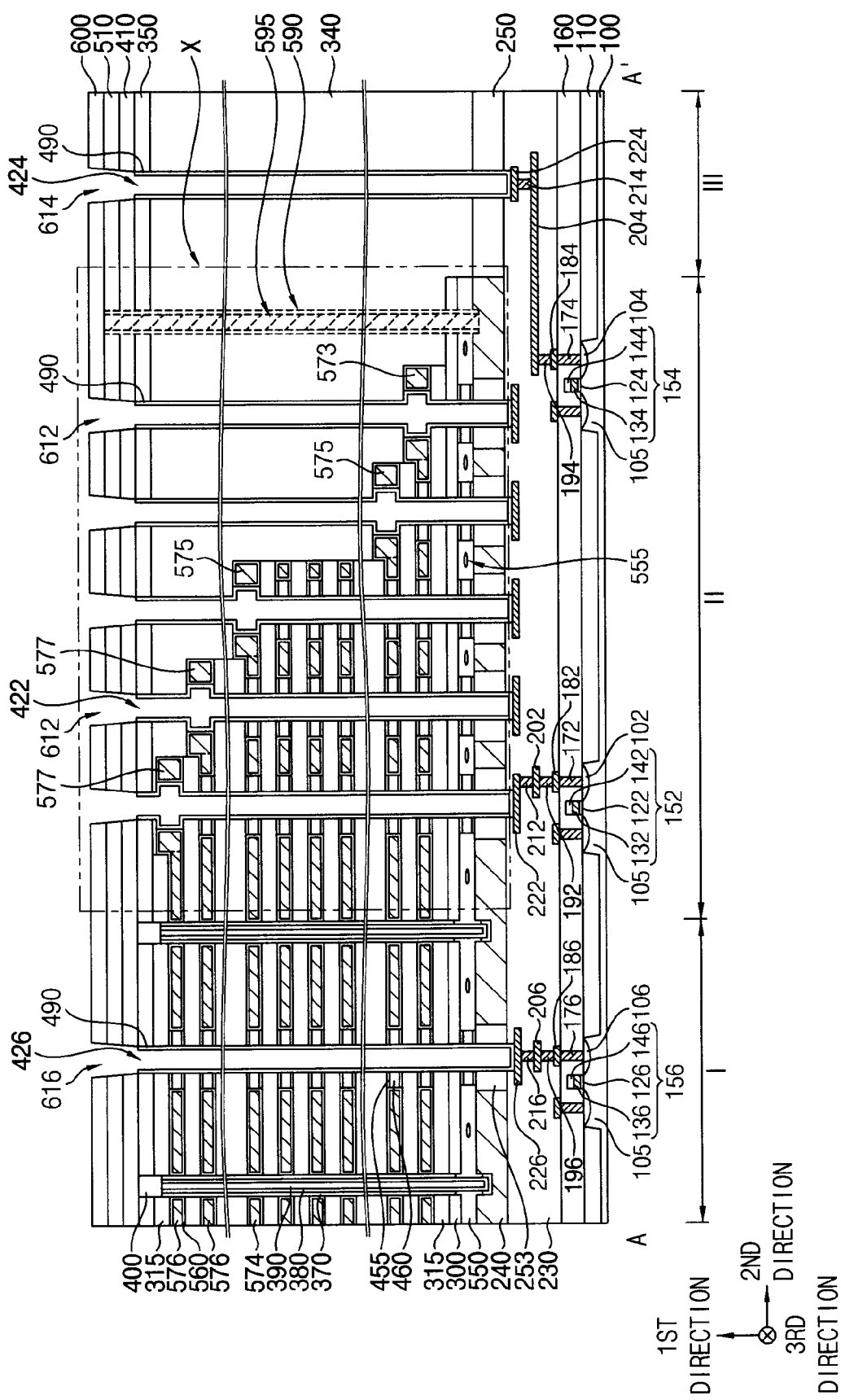
FIG. 25 illustrates a cross-sectional view taken along line A-A' in FIG. 22 further descriptive of the method of manufacturing the vertical memory device.
Figure 26:
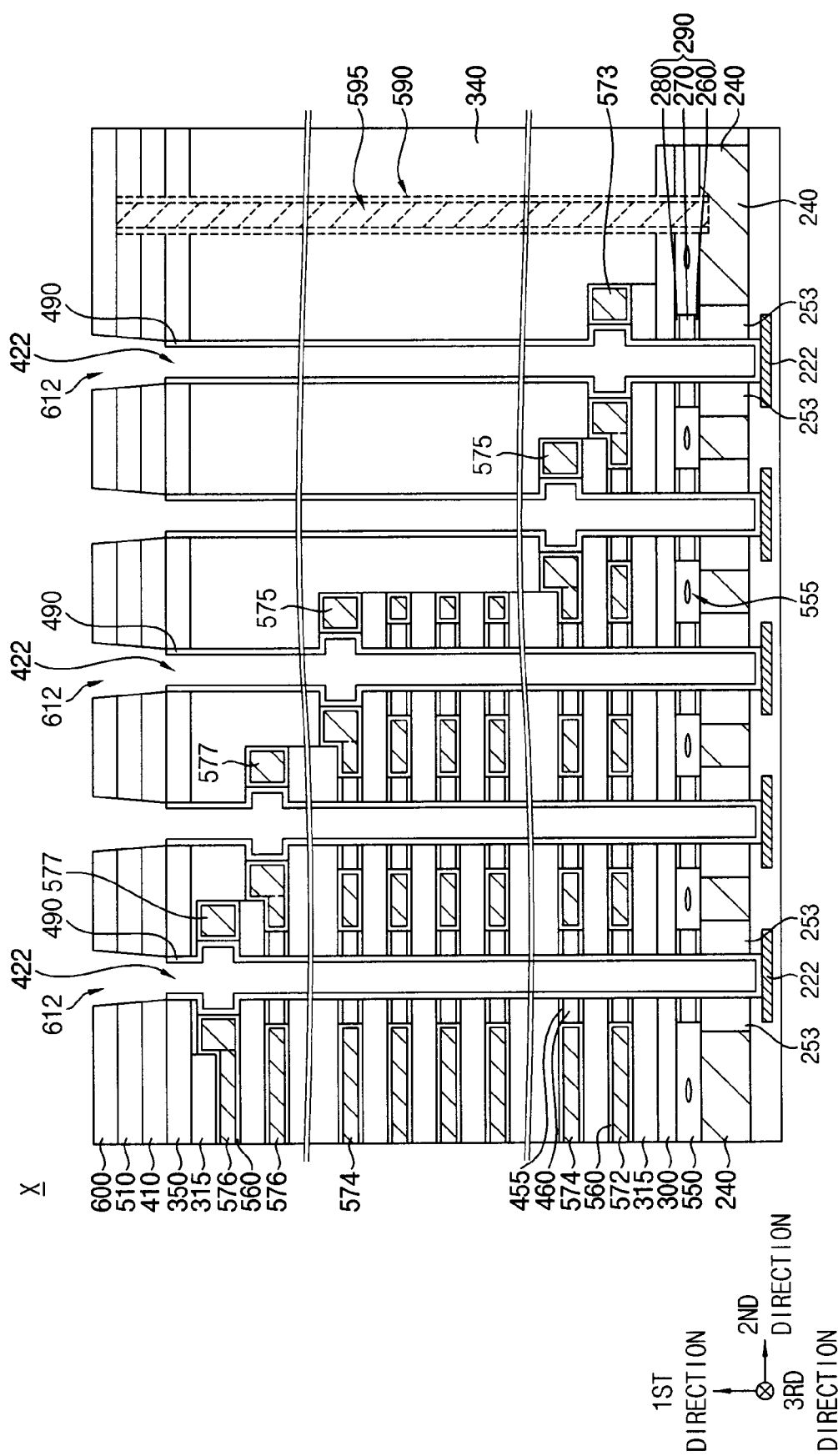
FIG. 26 illustrates an enlarged cross-sectional view of region X of FIG. 25.
Figure 27:
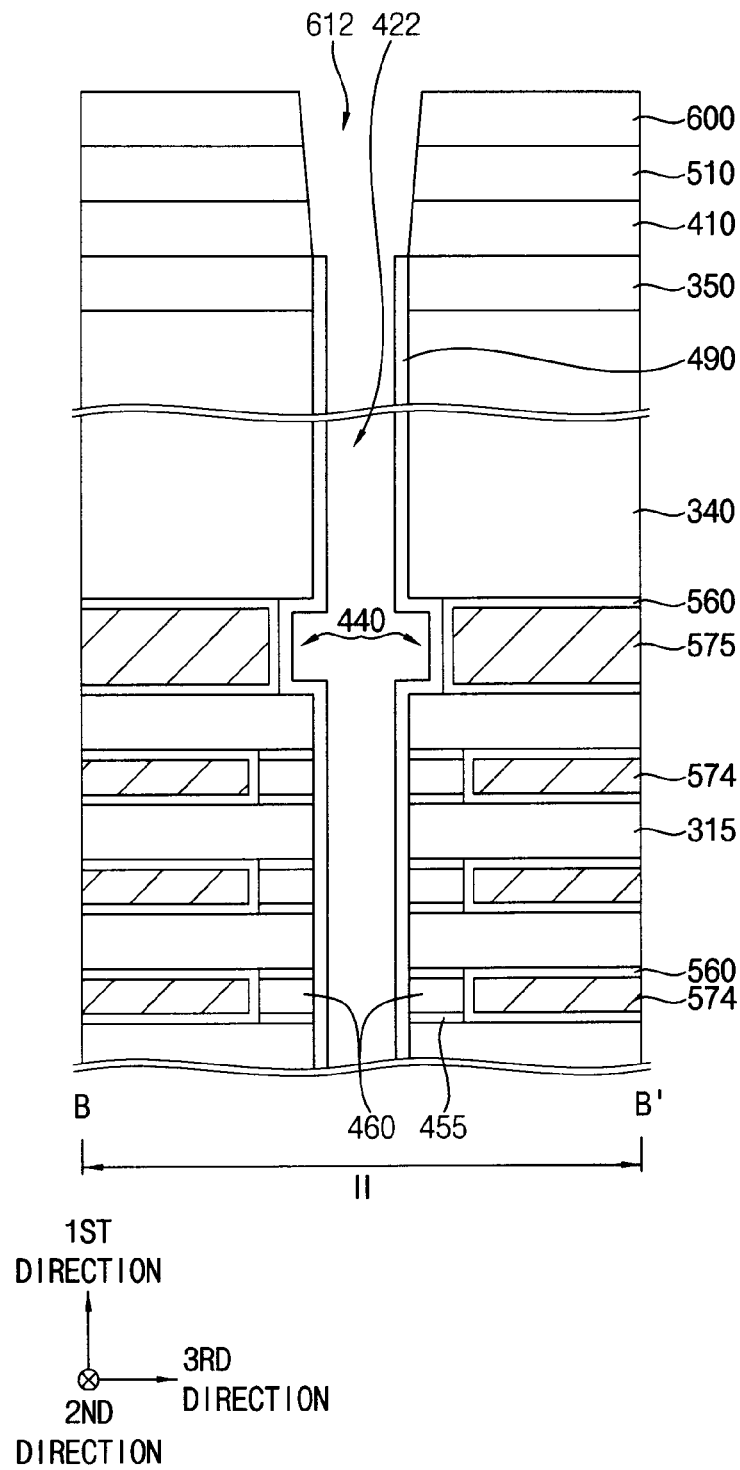
FIG. 27 illustrates a cross-sectional view taken along line B-B' in FIG. 22 descriptive of the method of manufacturing the vertical memory device.

Referring to FIGS. 25 to 27, a ninth insulating interlayer 600 may be formed on the eighth insulating interlayer 510, the first upper contact plug 595 and the fifth spacer 590. Fifth to seventh through holes 612, 614 and 616 may then be formed through the seventh to ninth insulating interlayers 410, 510 and 600 to expose the fifth to seventh sacrificial patterns 502, 504 and 506, respectively, by an etching process using an etching mask.

The third spacer 490 may also be exposed by the fifth to seventh through holes 612, 614 and 616. The fifth to seventh through holes 612, 614 and 616 may extend through the sixth to ninth insulating interlayers 350, 410, 510 and 600, or through the eighth to ninth insulating interlayers 510 and 600.

In example embodiments, each of the fifth to seventh through holes 612, 614 and 616 may have a width gradually decreasing from a top toward a bottom thereof, due to the characteristics of the etching process.

The exposed fifth to seventh sacrificial patterns 502, 504 and 506 may be removed by for example a wet etching process, and thus the first to third through holes 422, 424 and 426 may be formed again under the fifth to seventh through holes 612, 614 and 616, respectively, to be connected thereto, and the second gap 440 may be formed again.

Figure 28:
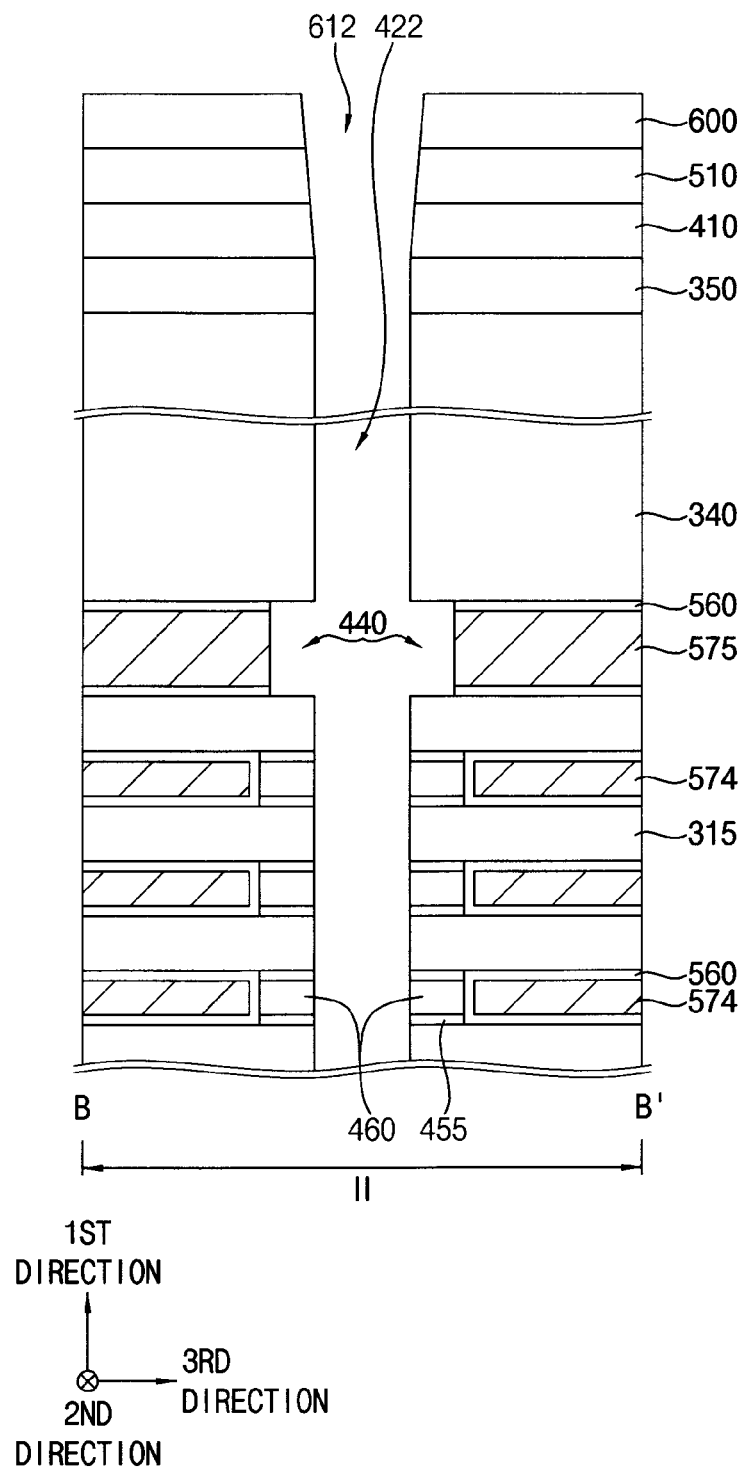
FIG. 28 illustrates a cross-sectional view taken along line B-B' in FIG. 22 further descriptive of the method of manufacturing the vertical memory device.
Figure 29:
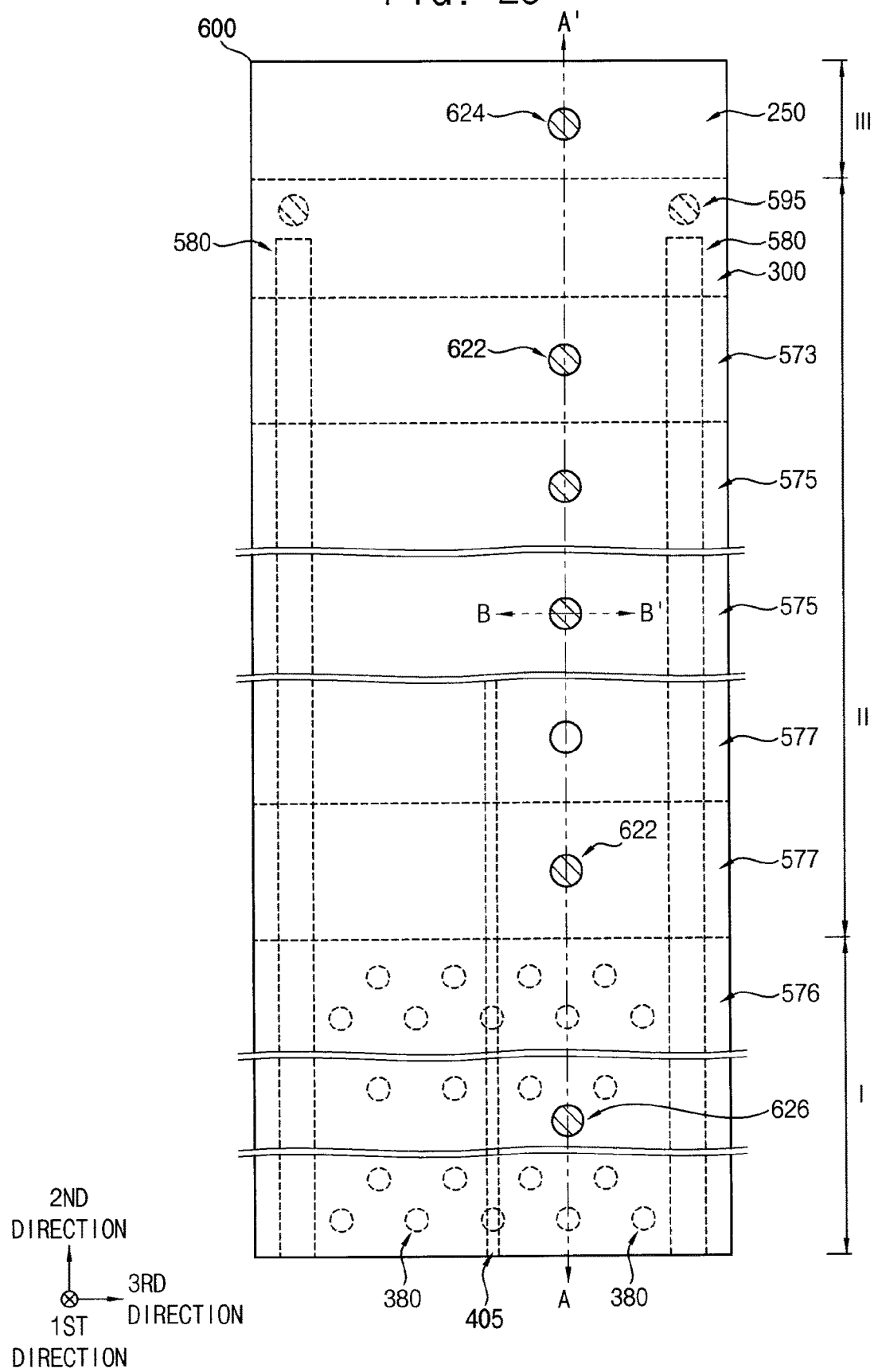
FIG. 29 illustrates a plan view further descriptive of the method of manufacturing a vertical memory device.
Figure 30:
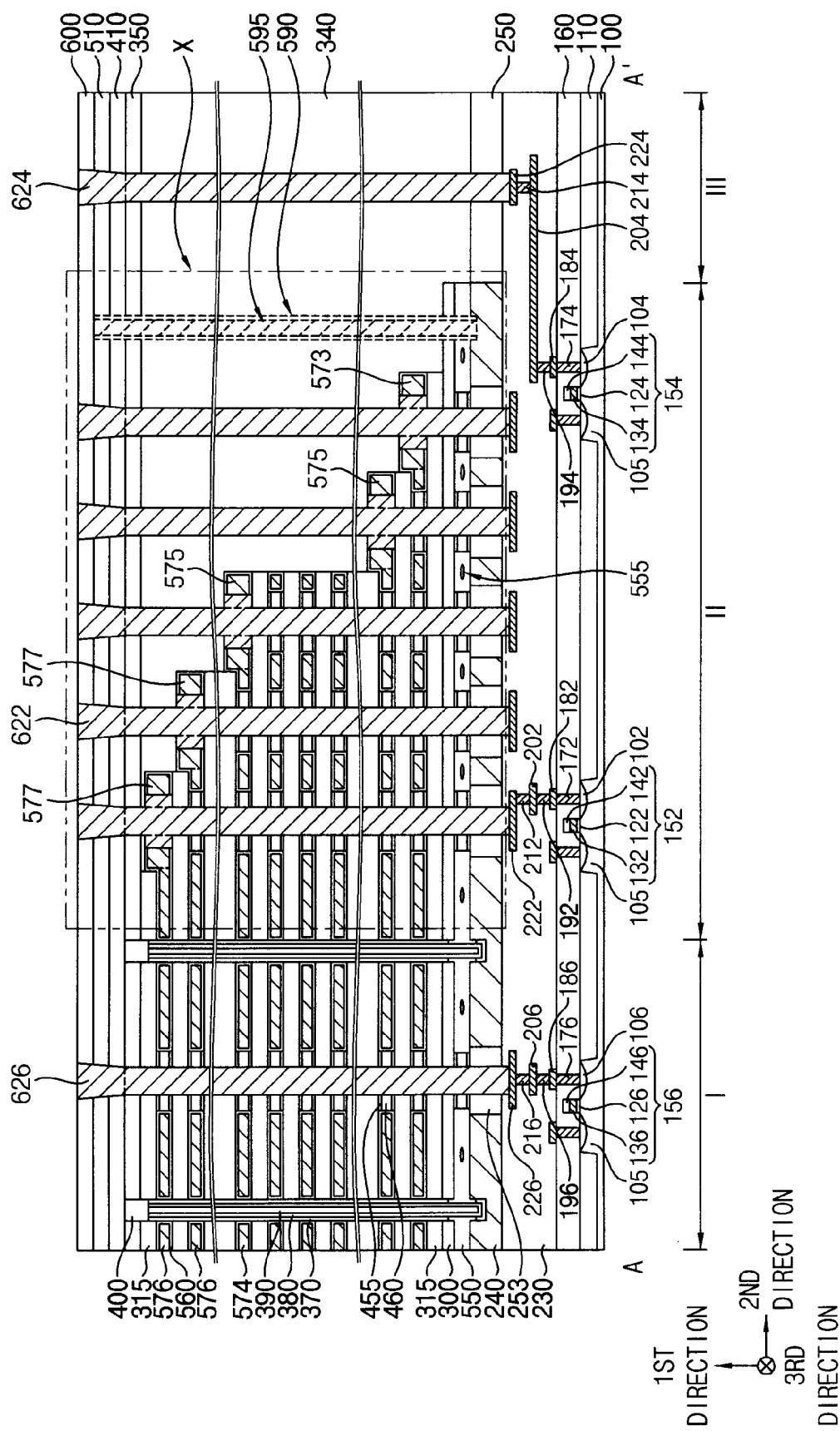
FIG. 30 illustrates a cross-sectional view taken along line A-A' in FIG. 29 descriptive of the method of manufacturing the vertical memory device.

Referring to FIG. 28, the third spacer 490 may be removed, and portions of the second blocking pattern 560 on sidewalls of the conductive pads 573, 575 and 577 of the first to third gate electrodes 572, 574 and 576, respectively, may be also removed. Thus, the upper surfaces of the seventh to ninth lower wirings 222, 224 and 226 and the sidewalls of the conductive pads 573, 575 and 577 of the first to third gate electrodes 572, 574 and 576, respectively, may be exposed.

In example embodiments, the third spacer 490 and the portions of the second blocking pattern 560 may be removed by a wet etching process.

Referring to FIGS. 29 to 32, first to third conductive through vias 622, 624 and 626 may be formed in the first to third through holes 422, 424 and 426 and the fifth to seventh through holes 612, 614 and 616.

The first conductive through via 622 may fill the first and fifth through holes 422 and 612 to contact the upper surface of the seventh lower wiring 222. The second conductive through via 624 may fill the second and sixth through holes 424 and 614 to contact the upper surface of the eighth lower wiring 224. The third conductive through via 626 may fill the third and seventh through holes 426 and 616 to contact the upper surface of the ninth lower wiring 226.

In example embodiments, the first conductive through via 622 may extend through (ones or some of) a plurality of gate electrodes 572, 574 and 576. The first conductive through via 622 may directly contact one of the conductive pads 573, 575 and 577 included in an uppermost one of the plurality of gate electrodes 572, 574 and 576 to be electrically connected thereto, and may be electrically insulated from other ones of the plurality of gate electrodes 572, 574 and 576 by the second insulation pattern 460 and the first spacer 455.

Each of the first and third conductive through vias 622 and 626 may extend through the fourth insulating interlayer pattern 253 in the CSP 240, and may be electrically insulated from the CSP 240.

In example embodiments, each of the first to third conductive through vias 622, 624 and 626 may include a lower portion having a constant width in the first direction, and an upper portion having a width gradually increasing from a bottom toward a top thereof in the first direction.

Figure 33:
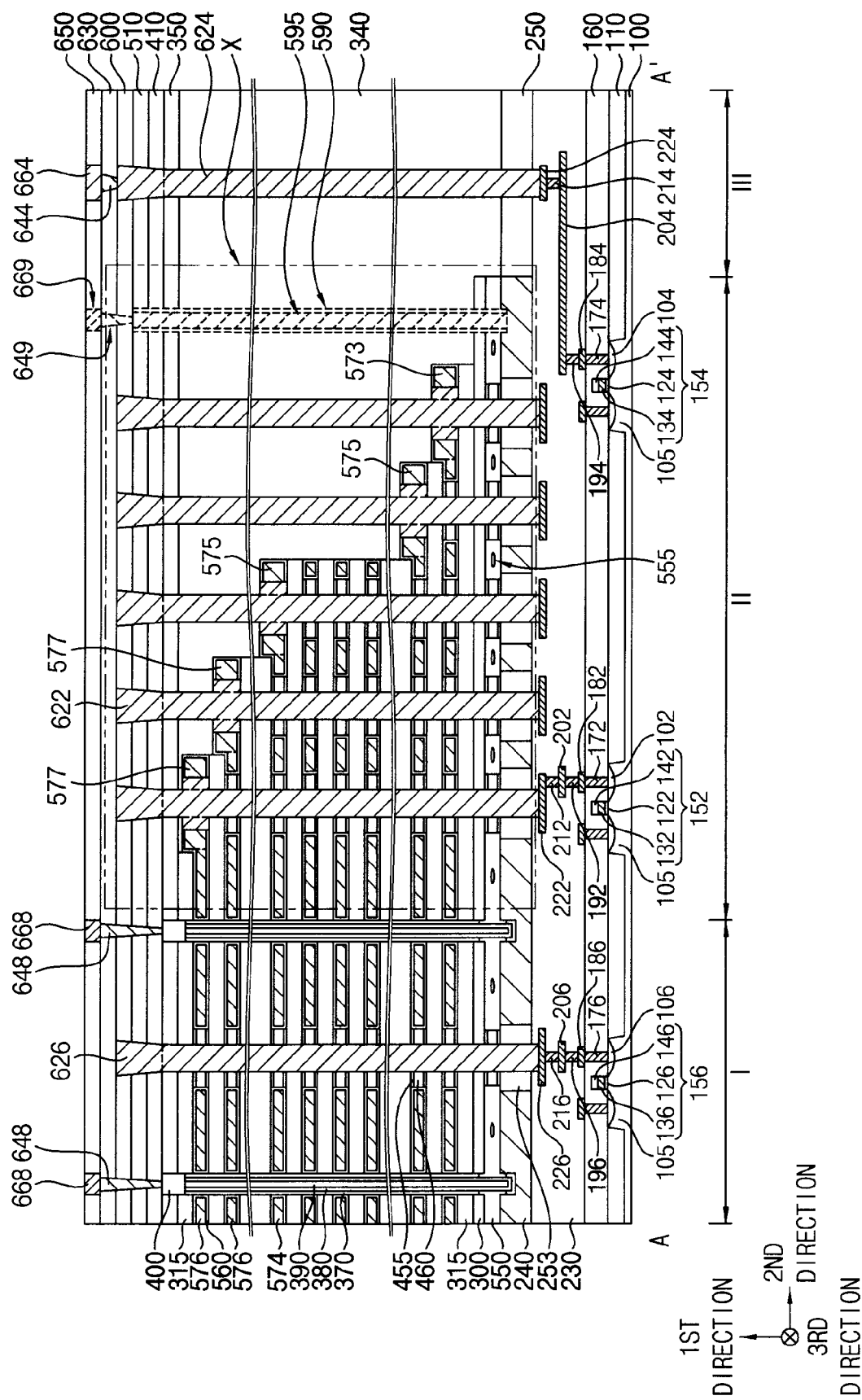
FIG. 33 illustrates a cross-sectional view taken along line A-A' in FIG. 29 further descriptive of the method of manufacturing the vertical memory device.

Referring to FIG. 33, a tenth insulating interlayer 630 may be formed on the ninth insulating interlayer 600 and the first to third conductive through vias 622, 624 and 626. A first upper via 644 may be formed extending through the tenth insulating interlayer 630 to contact an upper surface of the second conductive through via 624. A second upper via 648 may be formed extending through the seventh to tenth insulating interlayers 410, 510, 600 and 630 to contact an upper surface of the first capping pattern 400. A third upper via 649 may be formed through the ninth and tenth insulating interlayers 600 and 630 to contact an upper surface of the first upper contact plug 595.

An eleventh insulating interlayer 650 may be formed on the tenth insulating interlayer 630 and the first to third upper vias 644, 648 and 649. First to third upper wirings 664, 668 and 669 may be formed through the eleventh insulating interlayer 650 to contact upper surfaces of the first to third upper vias 644, 648 and 649, respectively.

In example embodiments, the second upper wiring 668 may extend in the third direction, and a plurality of second upper wirings 668 may be formed to be spaced apart from each other in the second direction. Each of the second upper wirings 668 may be electrically connected to the channels 380 through the second upper via 648 and the first capping pattern 400, and may serve as a bit line.

The tenth and eleventh insulating interlayers 630 and 650 may include an oxide such as for example silicon oxide. The first to third upper vias 644, 648 and 649 and the first to third upper wirings 664, 668 and 669 may include for example a metal, a metal nitride, a metal silicide, doped polysilicon, or other suitable material.

As illustrated above, each of the first conductive through vias 622 electrically connected to a corresponding one of the gate electrodes 572, 574 and 576 may be formed on the second region II of the substrate 100. Each of the first conductive through vias 622 may extend through the conductive pad of the corresponding one of the gate electrodes 572, 574 and 576, and may also extend through other ones of the gate electrodes 572, 574 and 576, but however may be electrically insulated from the other ones of the gate electrodes 572, 574 and 576 by the second insulation pattern 460 and the first spacer 455. Thus, when the first conductive through vias 622 are formed, in order to be electrically connected to only a corresponding one of the gate electrodes 572, 574 and 576, there is no need to prevent the punch-through phenomenon in which each of the first conductive through vias 622 extend through other ones of the gate electrodes 572, 574 and 576 to be electrically connected thereto, and thus the formation of the first conductive through vias 622 may be easier.

The first conductive through vias 622 may extend not only through the gate electrodes 572, 574 and 576, but also through the support layer 300, the channel connection pattern 550, the CSP 240 and an upper portion of the second insulating interlayer 230 to contact the seventh lower wiring 222. The first conductive through vias 622 may thus be formed by the same process for forming the second and third conductive through vias 624 and 626 which contact the eighth and ninth lower wirings 224 and 226, respectively, on the third and first regions III and I, respectively, of the substrate 100, which may simplify the total processes. Additionally, electrical signals may be applied to the first conductive through vias 622 by the seventh lower wiring 222, and thus there is no need to form upper wirings for applying electrical signals thereto, which may increase the freedom of layout of the upper wirings.

Furthermore, before the fourth sacrificial patterns 325 are removed to form the fifth gaps and the gate electrodes 572, 574 and 576 that fill the fifth gaps, the first and third conductive through vias 622 and 626 may be formed on the first and second regions I and II of the substrate 100 form, so that the mold will not fall down because the first and third conductive through vias 622 and 626 support the mold, even though dummy channels for supporting the mold during the formation of the fifth gaps are not formed. Accordingly, only the first conductive through vias 622 may be formed and dummy channels need not be formed in each of the conductive pads 573, 575 and 577, and thus the first conductive through vias 622 need not have a small size in order to keep a distance from the dummy channels, which may increase the freedom of layout of the first conductive through vias 622.

The vertical memory device manufactured by the above processes may have the following structural characteristics.

The vertical memory device may include transistors on the first to third regions I, II and III of the substrate 100; the seventh to ninth lower wirings 222, 224 and 226 electrically connected to the transistors; the CSP 240 over the seventh to ninth lower wirings 222, 224 and 226 on the first and second regions I and II of the substrate 100; the channel connection pattern 550 and the support layer 300 sequentially stacked on the CSP 240; the gate electrodes 572, 574 and 576, each of which may extend in the second direction, spaced apart from each other in the first direction on the support layer 300 on the first and second regions I and II of the substrate 100 and having a staircase shape on the second region II of the substrate 100; the channels 380, each of which may extend through the gate electrodes 572, 574 and 576, the support layer 300 and the channel connection pattern 550 in the first direction on the CSP 240 on the first region I of the substrate 100, electrically connected to each other by the channel connection pattern 550; the first conductive through via 622 extending through ones of the gate electrodes 572, 574 and 576, the channel connection pattern 550, the support layer 300 and the CSP 240 to be electrically connected to the seventh lower wiring 222, but being electrically connected to only an uppermost one of the gate electrodes 572, 574 and 576 and being electrically insulated from other ones thereof; the second conductive through via 624 at the same level as the first conductive through via 622 and not extending through the gate electrodes 572, 574 and 576 and being electrically connected to the eighth lower wiring 224; the third conductive through via 626 at the same level as the first conductive through via 622 and extending through the gate electrodes 572, 574 and 576, the channel connection pattern 550, the support layer 300 and the CSP 240 to be electrically connected to the ninth lower wiring 226 and being electrically insulated from the gate electrodes 572, 574 and 576; an insulation structure(s) between the first conductive through via 622 and sidewalls of the other ones of the gate electrodes 572, 574 and 576, except for a sidewall of the uppermost one of the gate electrodes 572, 574 and 576, and between the third conductive through via 626 and sidewalls of the gate electrodes 572, 574 and 576; and the bit lines 668, each of which may extend in the third direction on the channels 380 to be electrically connected thereto, spaced apart from each other in the second direction.

In example embodiments, the first to third conductive through vias 622, 624 and 626 may have the same shape, size and height. That is, each of the first to third conductive through vias 622, 624 and 626 may include a vertical portion extending in the first direction and a slope portion having a width gradually increasing from a bottom toward a top thereof on the vertical portion. The vertical portion of each of the first to third conductive through vias 622, 624 and 626 may have a sidewall substantially perpendicular to the upper surface of the substrate 100, and the slope portion of each of the first to third conductive through vias 622, 624 and 626 may have a sidewall slanted with respect to the upper surface of the substrate 100. However, due to the characteristics of the etching process, even the sidewall of the vertical portion may be also slanted (e.g., slightly slanted), however a slope of the sidewall of the vertical portion may be greater than a slope of the sidewall of the slope portion.

Figure 31:
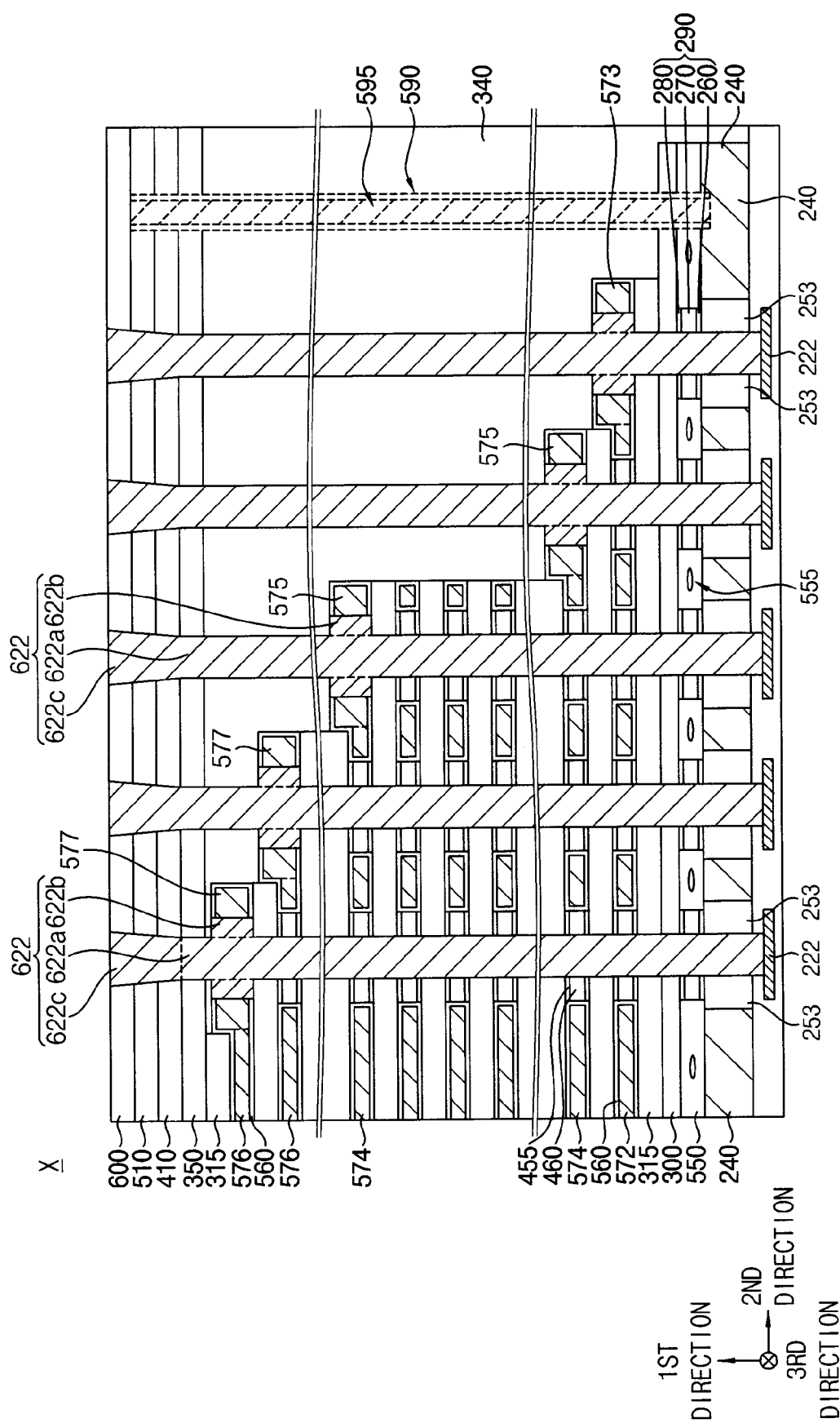
FIG. 31 illustrates an enlarged cross-sectional view of region X of FIG. 30.
Figure 32:
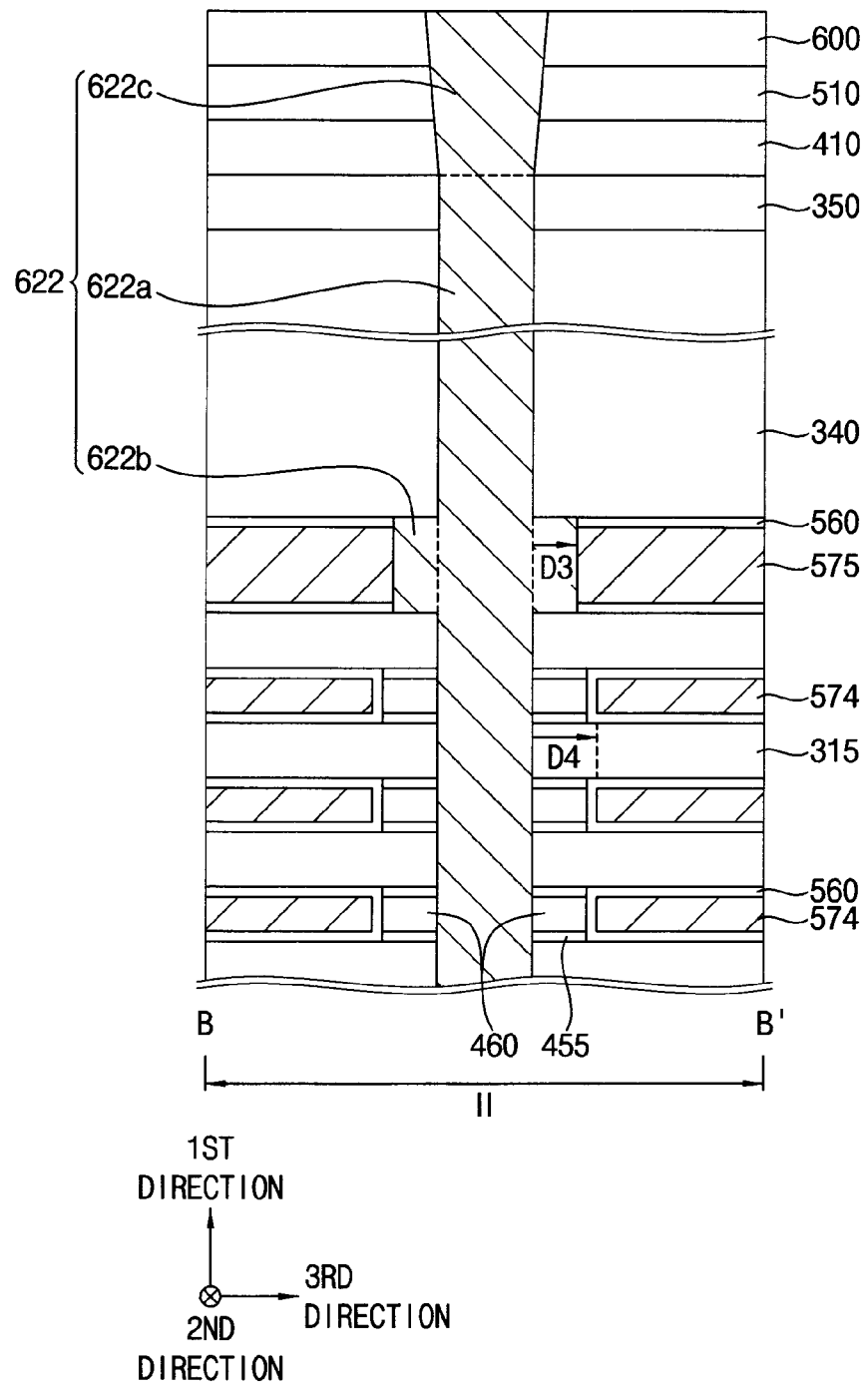
FIG. 32 illustrates a cross-sectional view taken along line B-B' in FIG. 29 descriptive of the method of manufacturing the vertical memory device.

In addition to a vertical portion 622*a* and a slope portion 622*c* such as shown in FIGS. 31 and 32 for example, the first conductive through via 622 may further include a protrusion portion 622*b* protruding from the vertical portion 622*a* in the horizontal direction. In example embodiments, the protrusion portion 622*b* of the first conductive through via 622 may contact and be electrically connected to the conductive pad 575 of the uppermost one among the gate electrodes 572, 574 and 576 through which the first conductive through via 622 extends, which conductive pad 575 may be formed at the end portion in the second direction to have a thickness greater than that of other portions of the uppermost one among the gate electrodes 572, 574 and 576 through which the first conductive through via 622 extends.

In example embodiments such as shown in FIG. 32, the insulation structure(s) may include the second insulation pattern 460 and the first spacer 455 covering the lower and upper surfaces of the second insulation pattern 460. In example embodiments, a third distance D3 from a sidewall of the vertical portion 622*a* of the first conductive through via 622 to a sidewall of the conductive pad 575 of the uppermost one of the gate electrodes 572, 574 and 576 facing the protrusion portion 622*b* of the first conductive through via 622 may be equal to or less than a fourth distance D4 from the sidewall of the vertical portion 622*a* of the first conductive through via 622 to sidewalls of the other ones of the gate electrodes 572, 574 and 576 under the uppermost one of the gate electrodes 572, 574 and 576. In example embodiments, the insulation structure(s) may be also formed between the sidewall of the first conductive through via 622 and the channel connection pattern 550 so as to electrically insulate each other.

In example embodiments such as shown in FIG. 32, the second blocking pattern 560 may cover lower and upper surfaces and a portion of a sidewall of each of the gate electrodes 572, 574 and 576, and may not be formed on the sidewall of the conductive pad of the uppermost one of the gate electrodes 572, 574 and 576 facing the protrusion portion 622*b* of the first conductive through via 622. That is, the second blocking pattern 560 may be formed on the sidewalls of the other ones of the gate electrodes 572, 574 and 576 facing a sidewall of the insulation structure(s) on the vertical portion 622*a* of the first conductive through via 622.

In example embodiments such as shown in FIG. 33, the fourth insulating interlayer pattern 253 may be formed between each of the first and second conductive through vias 622 and 624 and the CSP 240, and may electrically insulate each other.

In example embodiments, the first upper wiring 664 may be formed on the second conductive through via 624 to be electrically connected thereto, however upper wirings may be formed on and electrically connected to each of the first and third conductive through vias 622 and 626.

Figure 34:
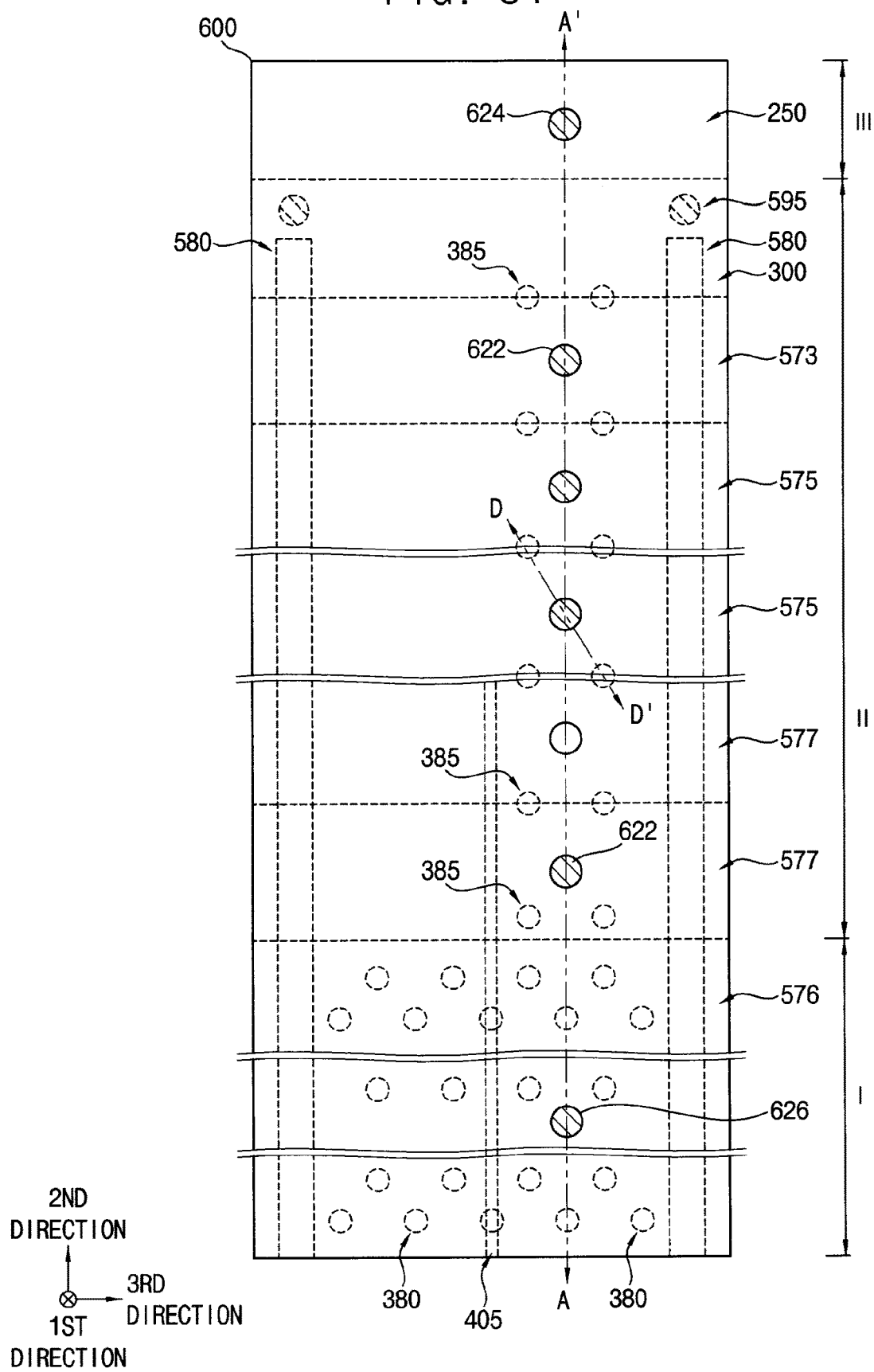
FIG. 34 illustrates a plan view descriptive of a method of manufacturing a vertical memory device in accordance with example embodiments of the inventive concepts.
Figure 35:
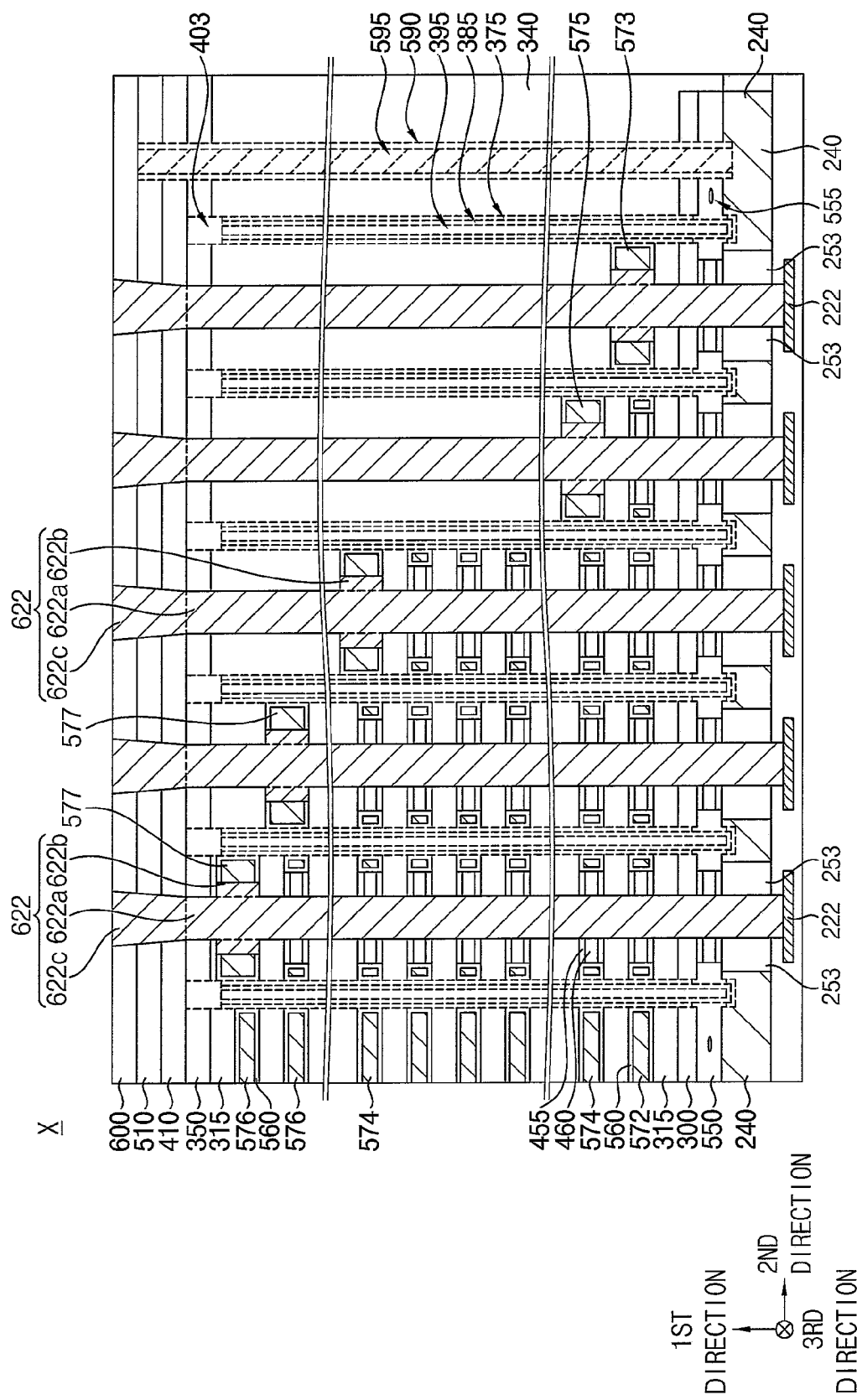
FIG. 35 illustrates an enlarged cross-sectional view of region X taken along line A-A' of FIG. 30.
Figure 36:
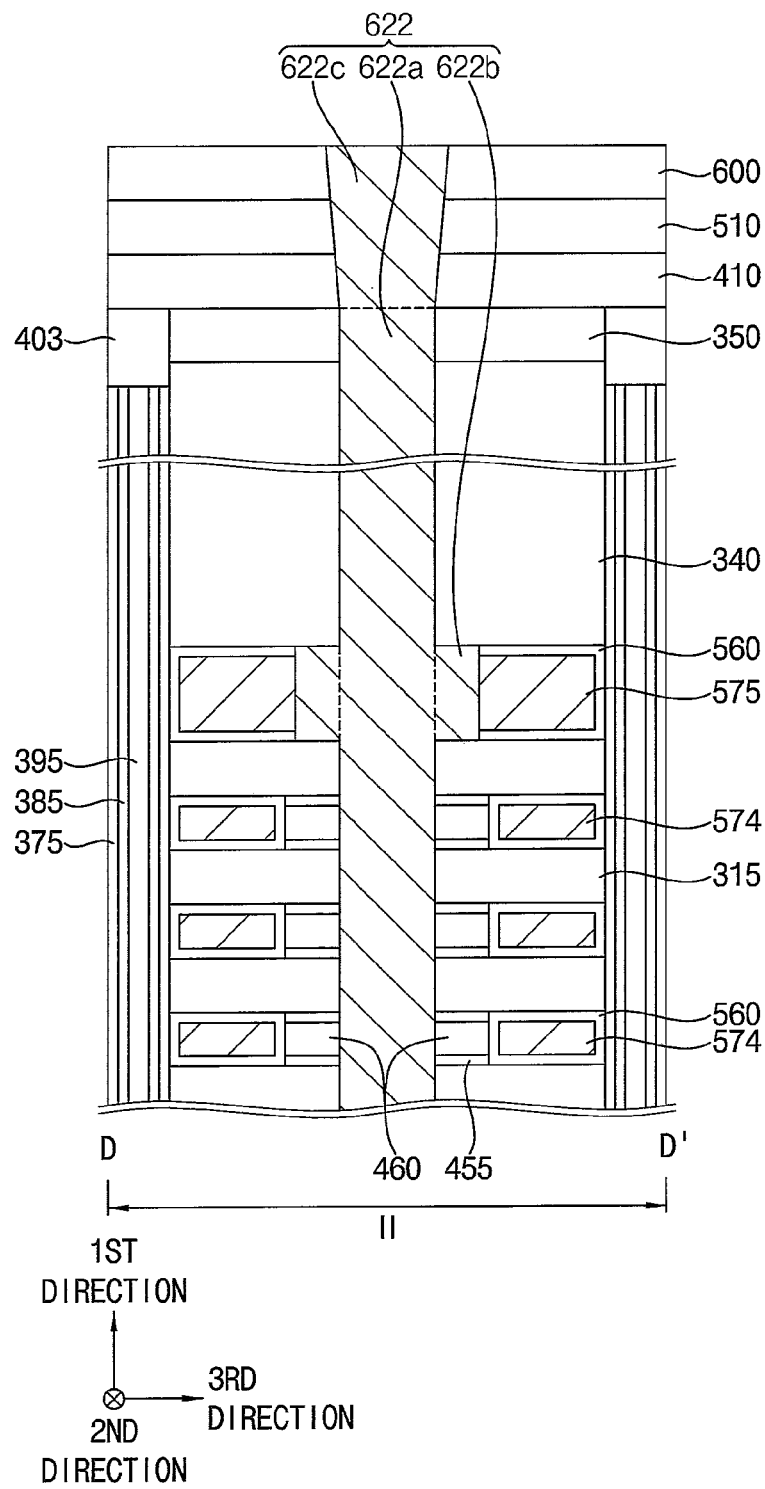
FIG. 36 illustrates a cross-sectional view taken along line D-D' in FIG. 34 descriptive of the method of manufacturing the vertical memory device.

FIGS. 34 to 36 are a plan view and cross-sectional views illustrating a vertical memory device in accordance with example embodiments. Specifically, FIG. 34 is the plan view, FIG. 35 is an enlarged cross-sectional view of a region X (refer to FIG. 30) in a cross-sectional view taken along a line A-A' of FIG. 34, and FIG. 36 is a cross-sectional view taken along a line D-D' of FIG. 34. This vertical memory device may be substantially the same as or similar to that of FIGS. 29 to 33, except for some elements. Thus, like reference numerals refer to like elements, and repeated descriptions thereof are omitted from the following.

Referring to FIGS. 34 to 36, the vertical memory device may include a second pillar structure extending through a portion of the fifth insulating interlayer 340, the first insulation patterns 315, the gate electrodes 572, 574 and 576, the support layer 300, and the channel connection pattern 550 to contact a portion of the CSP 240 on the second region II of the substrate 100. Additionally, a second capping pattern 403 is included extending through a portion of the fifth insulating interlayer 340 and the sixth insulating interlayer 350 on the second pillar structure.

The second pillar structure may include a dummy charge storage structure 375, a dummy channel 385 and a first dummy filling pattern 395 sequentially stacked correspondingly to those of the first pillar structure. The dummy charge storage structure 375 may include a dummy tunnel insulation pattern, a dummy charge storage pattern, and a first dummy blocking pattern sequentially staked from an outer sidewall of the dummy channel 385 in the horizontal direction. The dummy tunnel insulation pattern may include an oxide such as for example silicon oxide, the dummy charge storage pattern may include a nitride such as for example silicon nitride, and the first dummy blocking pattern may include an oxide such as for example silicon oxide.

In example embodiments, the second pillar structure may be formed at a boundary area between an upper step and a lower step of the mold. That is, the second pillar structure may contact an end portion in the second direction of a corresponding one or ones of the conductive pads 573, 575 and 577 of one or ones of the gate electrodes 572, 574 and 576, and may extend through other ones of the gate electrodes 572, 574 and 576. In example embodiments, a plurality of second pillar structures may be spaced apart from each other with a corresponding one of the first conductive through vias 622 at a central position therebetween, and as shown in FIG. 34, the second pillar structures are arranged at four vertices, respectively, with a corresponding one of the first conductive through vias 622 at a central position. However, the inventive concepts are not limited to arrangement of the second pillar structures at the four vertices as described.

The second pillar structure including the dummy channel 385 may be formed by the same process as the first pillar structure including the channel 380, and thus when the process illustrated with reference to FIGS. 19 and 20 is performed, that is, the process for forming the fifth gap by removing the fourth sacrificial patterns 325, the second pillar structure together with the fifth and seventh sacrificial patterns 502 and 506 may prevent the mold from falling down. However, the fifth and seventh sacrificial patterns 502 and 506 already have been formed, and thus a minimum number of the second pillar structure including the dummy channel 385 may be formed so as to increase the freedom of layout of the first conductive through vias 622.

Figure 37:
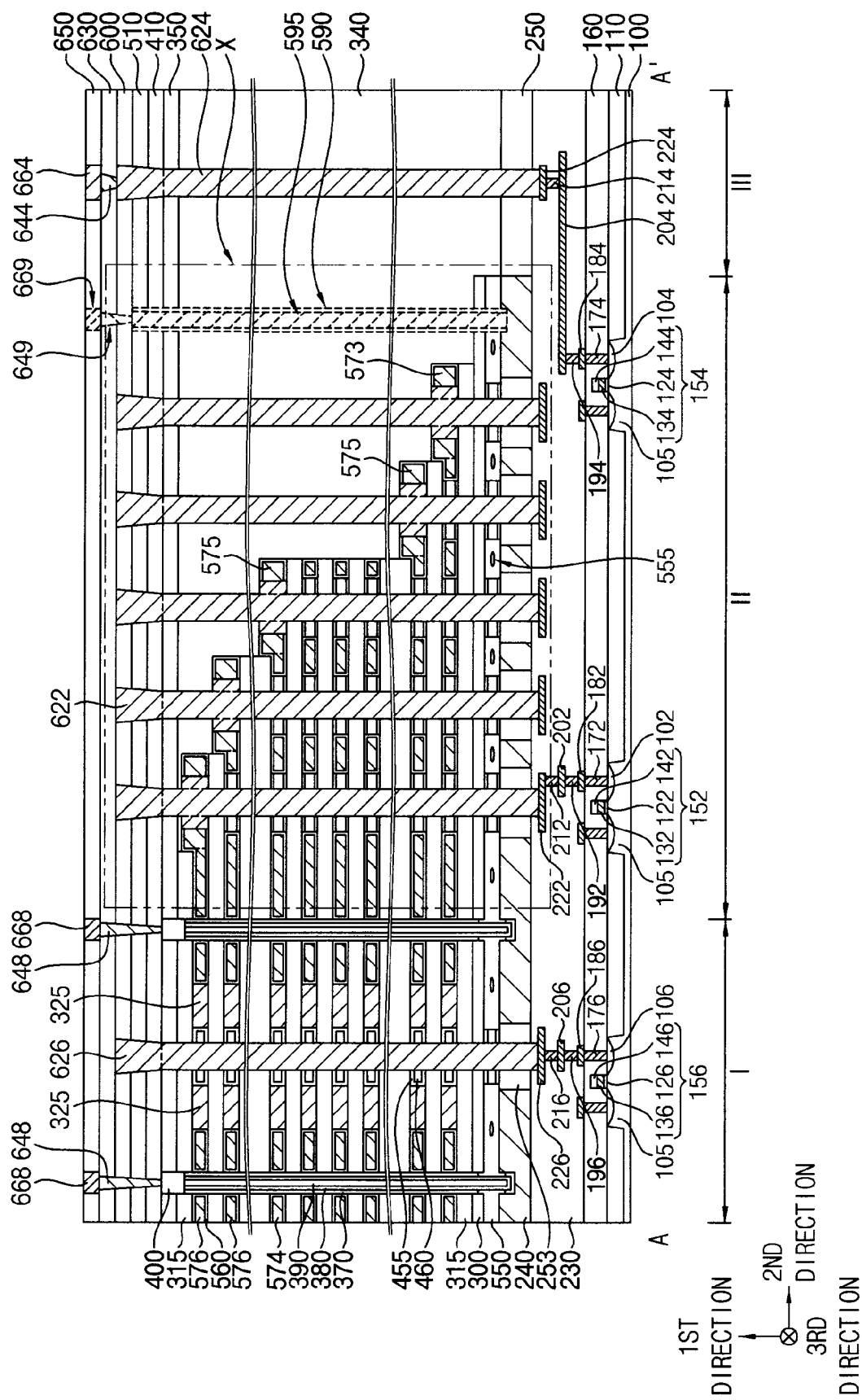
FIG. 37 illustrates a cross-sectional view taken along line A-A' in FIG. 34 descriptive of a method of manufacturing the vertical memory device.

FIG. 37 is a cross-sectional view illustrating a vertical memory device in accordance with example embodiments. This vertical memory device may be substantially the same as or similar to that of FIGS. 29 to 33, except for some elements. Thus, like reference numerals refer to like elements, and repeated descriptions thereof are omitted from the following.

Referring to FIG. 37, some of the fourth sacrificial patterns 325 including a nitride such as silicon nitride for example are not replaced with the gate electrodes 572, 574 and 576 but remain on the first region I of the substrate 100. Also, the third conductive through via 626 may extend through the fourth sacrificial patterns 325 instead of the gate electrodes 572, 574 and 576. Thus, the fourth sacrificial pattern 325 may be interposed between a sidewall of the third conductive through via 626 and a sidewall of each of the gate electrodes 572, 574 and 576.

The first spacer 455 may cover not only the lower and upper surfaces of the second insulation pattern 460, but also a sidewall of the second insulation pattern 460 facing the fourth sacrificial pattern 325.

During the process illustrated with reference to FIGS. 19 and 20, that is, the process for removing the fourth sacrificial patterns 325 through the second openings 520, portions of the fourth sacrificial patterns 325 at a central area between the second openings 520 neighboring in the third direction may not be removed but remain, and the third conductive through via 626 shown in FIG. 37 is formed at the central area.

Figure 38:
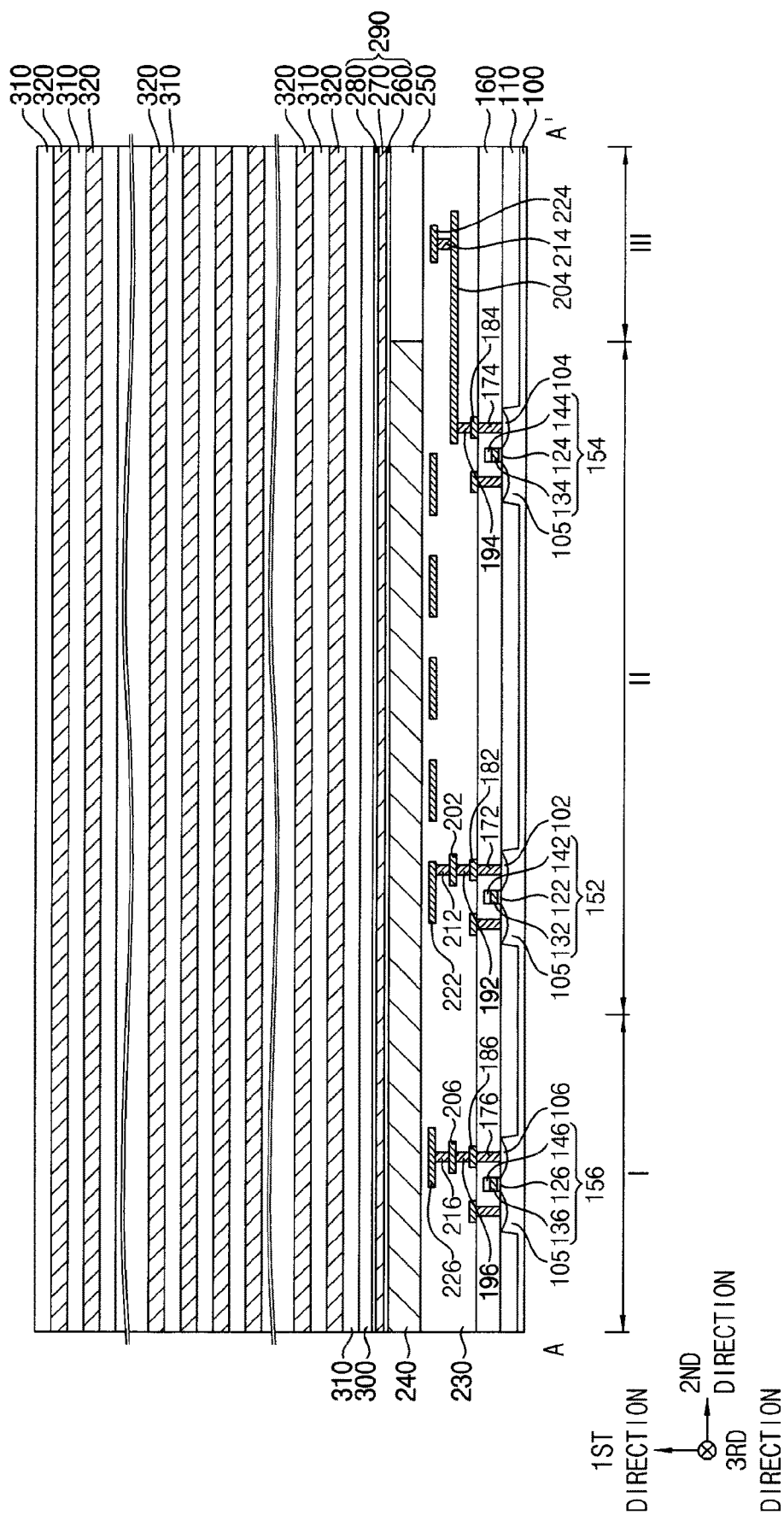
FIG. 38 illustrates a cross-sectional view taken along line A-A' in FIG. 34 descriptive of a method of manufacturing the vertical memory device.
Figure 39:
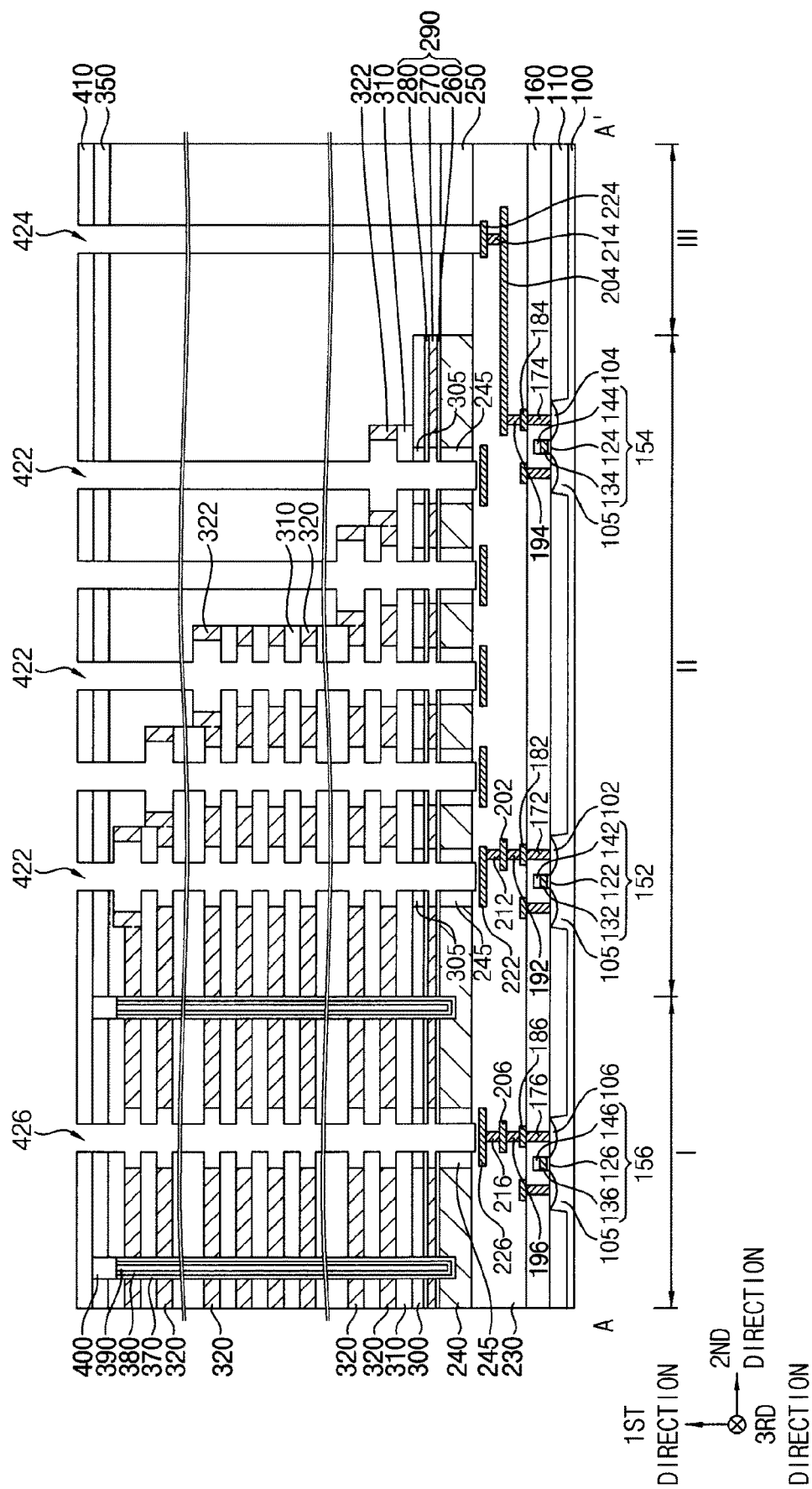
FIG. 39 illustrates a cross-sectional view taken along line A-A' in FIG. 34 further descriptive of the method of manufacturing the vertical memory device.
Figure 40:
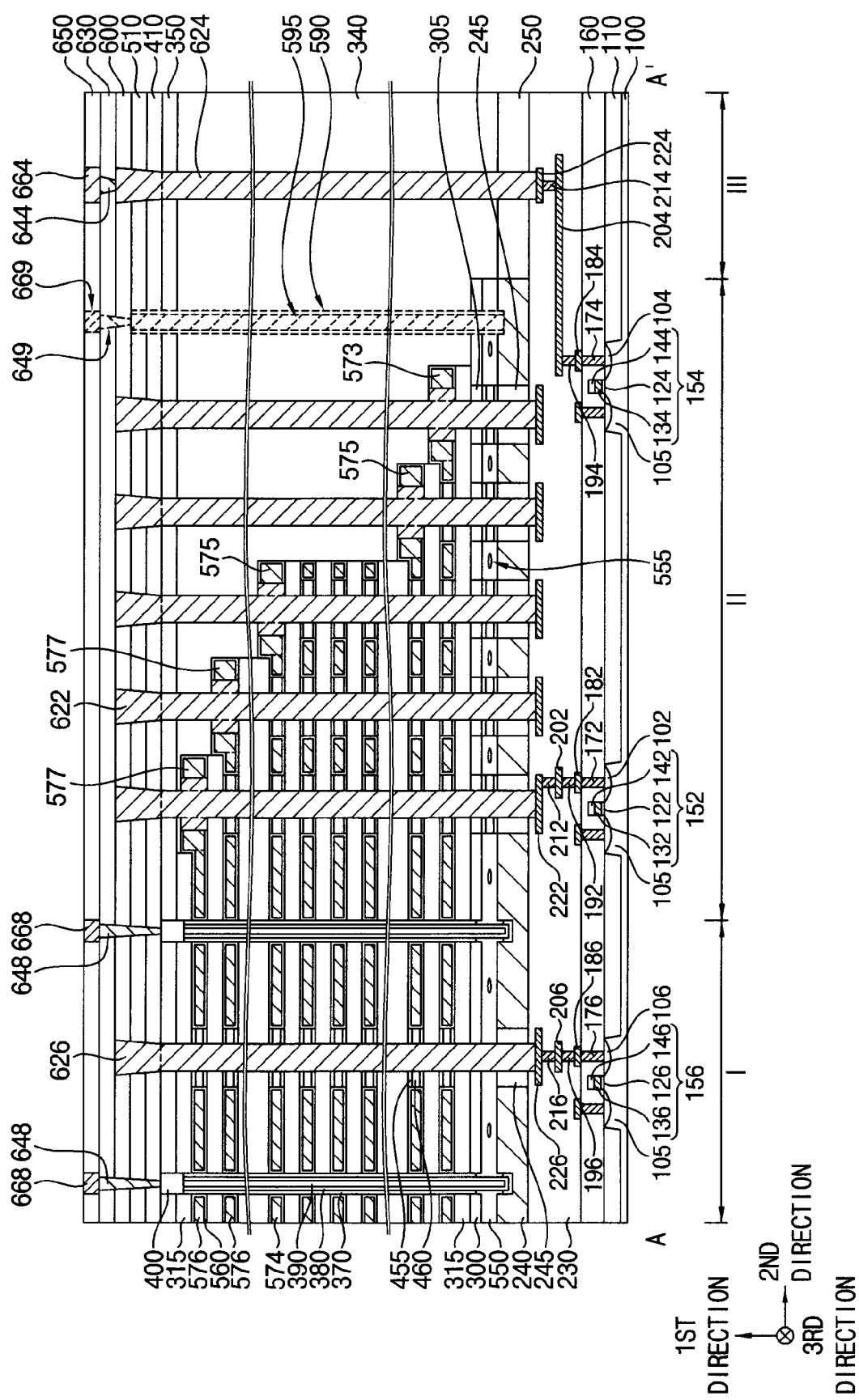
FIG. 40 illustrates a cross-sectional view taken along line A-A' in FIG. 34 further descriptive of the method of manufacturing the vertical memory device.

FIGS. 38 to 40 are cross-sectional views illustrating a method of manufacturing a vertical memory device in accordance with example embodiments. This method may include processes substantially the same as or similar to that of FIGS. 1 to 33, and thus repeated descriptions thereof are omitted from the following.

Referring to FIG. 38, processes substantially the same as or similar to FIGS. 1 to 3 may be performed.

However, the CSP 240 may be formed on an entire portion of the first and second regions I and II of the substrate 100, and the fourth insulating interlayer pattern 253 is not formed.

Referring to FIG. 39, processes substantially the same as or similar to FIGS. 4 to 11 may be performed.

However, each of the first to third through holes 422, 424 and 426 may expose an upper surface of the CSP 240 by a first etching process, and the exposed portion of the CSP 240 may be removed by a second etching process to expose an upper surface of the second insulating interlayer 230, so that a sidewall of the CSP 240 may be exposed by each of the first to third through holes 422, 424 and 426.

The exposed sidewalls of the first to third through holes 422, 424 and 426 may be oxidized to form a third insulation pattern 245 including silicon oxide. A fourth insulation pattern 305 may be formed on a sidewall of the support layer 300 exposed by each of the first to third through holes 422, 424 and 426.

Referring to FIG. 40, the first to third through holes 422, 424 and 426 may be enlarged downwardly to expose upper surfaces of the seventh to ninth lower wirings 222, 224 and 226, respectively, and processes substantially the same as or similar to FIGS. 12 to 33 may be performed to complete the fabrication of the vertical memory device.

Thus, each of the first to third conductive through vias 622, 624 and 626 may be electrically insulated from the CSP 240 by the third insulation pattern 245 formed by oxidizing a sidewall of the CSP 240 instead of the fourth insulation pattern 253 formed by patterning the CSP 240. When the support layer 300 includes polysilicon doped with n-type impurities for example, the support layer 300 may be also electrically insulated from each of the first to third conductive through vias 622, 624 and 626 by the fourth insulation pattern 305.

As described above, although the invention concepts have been described with reference to example embodiments, those skilled in the art should readily appreciate that many modifications are possible in the example embodiments without materially departing from the novel teachings and advantages of the inventive concepts.

What is claimed is:

1. A vertical memory device, comprising:
gate electrodes spaced apart from each other in a first direction on a substrate, the first direction perpendicular to an upper surface of the substrate, and the gate electrodes stacked in a staircase shape;
a channel extending through the gate electrodes in the first direction;
a first conductive through via extending through a conductive pad of a first gate electrode from among the gate electrodes and electrically connected to the conductive pad, the first gate electrode being at an uppermost level of the stacked staircase shape of gate electrodes, the first conductive through via extending through second gate electrodes from among the gate electrodes that are disposed under the first gate electrode;
a second conductive through via at the same level as the first conductive through via, the second conductive through via extending through and insulated from each of the gate electrodes of the stacked staircase shape of gate electrodes, the second conductive through via being electrically connected to a lower wiring formed on the substrate;
a common source plate (CSP) on the lower wiring, wherein the first conductive through via extends through the CSP;
a plurality of first insulation structures between the first conductive through via and respective sidewalls of the second gate electrodes facing the first conductive through via, the plurality of first insulation structures electrically insulating the first conductive through via from the respective second gate electrodes;
a plurality of second insulation structures between the second conductive through via and respective sidewalls of the gate electrodes facing the second conductive through via, the plurality of second insulation structures electrically insulating the second conductive through via from the respective gate electrodes, wherein the plurality of second insulation structures are respectively disposed at different levels, each level corresponding to a respective one of the gate electrodes,
wherein each of the gate electrodes extends in a second direction parallel to the upper surface of the substrate, and
wherein the conductive pad is formed at an end portion in the second direction of the first gate electrode, and a portion of the conductive pad that is in direct contact with the first conductive through via has a thickness in the first direction greater than that of other portions of the first gate electrode.

2. The vertical memory device of claim 1, wherein the first conductive through via comprises:
a vertical portion extending in the first direction; and
a protrusion portion protruding from the vertical portion m a horizontal direction parallel to the upper surface of the substrate, and
wherein the protrusion portion contacts a sidewall of the conductive pad of the first gate electrode.

3. The vertical memory device of claim 2, wherein the first conductive through via further includes a slope portion on the vertical portion, the slope portion having a width that gradually increases from a bottom of the slope portion toward a top of the slope portion.

4. The vertical memory device of claim 2, wherein a distance from a sidewall of the vertical portion of the first conductive through via to the sidewall of the conductive pad of the first gate electrode facing the protrusion portion of the first conductive through via is equal to or less than distances from the sidewall of the vertical portion of the first conductive through via to the respective sidewalls of the second gate electrodes facing the first conductive through via.

5. The vertical memory device of claim 1, wherein each of the second plurality of insulation structures comprises:
an insulation pattern; and
a spacer covering lower and upper surfaces of the insulation pattern.

6. The vertical memory device of claim 5, wherein the insulation pattern comprises an oxide, and the spacer comprises a nitride.

7. The vertical memory device of claim 1, further comprising a blocking pattern covering lower and upper surfaces of each of the gate electrodes,
wherein the blocking pattern is not formed on a sidewall of the conductive pad of the first gate electrode facing the first conductive through via, and is formed on each of the sidewalls of the respective second gate electrodes facing the first conductive through via.

8. The vertical memory device of claim 7, wherein the blocking pattern comprises a metal oxide.

9. The vertical memory device of claim 1, wherein each of the gate electrodes extends in a second direction parallel to the upper surface of the substrate, and
wherein conductive pads are respectively formed at an end portion in the second direction of each of the gate electrodes, and have a thickness in the first direction greater than that of other portions of each of the gate electrodes.

10. The vertical memory device of claim 1, further comprising a plurality of first conductive through vias spaced apart from each other in the second direction, the first conductive through via being one of the plurality of first conductive through vias.

11. The vertical memory device of claim 1, further comprising:
a lower circuit pattern electrically connected to the lower wiring; and
an insulating interlayer on the substrate, the insulating interlayer covering the lower circuit pattern,
wherein the common source plate (CSP) is disposed on the insulating interlayer, wherein the gate electrodes are formed on the CSP.

12. The vertical memory device of claim 11, wherein the first conductive through via further extends through an upper portion of the insulating interlayer, and is electrically connected to the lower circuit pattern.

13. The vertical memory device of claim 11, further comprising a third conductive through via at a same level as the first conductive through via, the third conductive through via not extending through the CSP and the gate electrodes, and the third conductive through via extending through an upper portion of the insulating interlayer to be electrically connected to the lower circuit pattern.

14. The vertical memory device of claim 13, wherein the second conductive through via further extends through the CSP and the upper portion of the insulating interlayer to be electrically connected to the lower circuit pattern.

15. The vertical memory device of claim 14, further comprising a silicon nitride layer between a sidewall of the second conductive through via and the respective sidewalls of the gate electrodes facing the second conductive through via.

16. The vertical memory device of claim 14, further comprising an upper wiring on the third conductive through via and electrically connected to the third conductive through via,
wherein no additional upper wiring is formed on each of the first and conductive through vias, and the upper wiring configured to apply electrical signals to each of the first and second conductive through vias.

17. A vertical memory device, comprising:
gate electrodes spaced apart from each other in a first direction on first and second regions of a substrate, the substrate including the first and second regions and a third region, the first direction perpendicular to an upper surface of the substrate, and the gate electrodes having a staircase shape on the second region of the substrate;
a channel extending through the gate electrodes in the first direction on the first region of the substrate;
a first conductive through via extending through some of the gate electrodes on the second region of the substrate, the first conductive through via electrically connected to a first gate electrode at an uppermost level of the some of the gate electrodes, and the first conductive through via electrically insulated from second gate electrodes from among the some of the gate electrodes that are disposed under the first gate electrode;
a second conductive through via at a same level as the first conductive through via on the third region of the substrate;
a third conductive through via at the same level as the first conductive through via on the first region of the substrate, the third conductive through via extending through and insulated from each of the gate electrodes of the staircase shape of gate electrodes and electrically insulated from the gate electrodes by a plurality of insulation structures, wherein the third conductive via is electrically connected to a lower wiring formed on the substrate, wherein the plurality of insulation structures are respectively disposed at different levels, each level corresponding to a respective one of the gate electrodes; and
a common source plate (CSP) on the lower wiring, wherein the first conductive through via extends through the CSP;
wherein the first to third conductive through vias have a same width, and
wherein each of the first to third conductive through vias comprises a vertical portion extending in the first direction, and a slope portion having a width that gradually increases from a bottom of the slope portion toward a top of the slope portion.

18. The vertical memory device of claim 17, further comprising an upper wiring on the second conductive through via, the upper wiring electrically connected to the second conductive through via,
wherein no additional upper wiring is formed on each of the first and third conductive through vias, and the upper wiring is configured to apply electrical signals to each of the first and third conductive through vias.

19. The vertical memory device of claim 17, further comprising:
a lower circuit pattern electrically connected to the lower wiring;
an insulating interlayer on the substrate, the insulating interlayer covering the lower circuit pattern; and
a common source plate (CSP) on the insulating interlayer, wherein
the gate electrodes are formed on the CSP.

20. A vertical memory device, comprising:
transistors on a substrate;
lower wirings on the substrate, the lower wirings electrically connected to the transistors;
a common source plate (CSP) on the lower wirings;
a channel connection pattern and a support layer sequentially stacked on the CSP; gate electrodes spaced apart from each other in a first direction on the substrate, the first direction perpendicular to an upper surface of the substrate, and the gate electrodes stacked in a staircase shape on the substrate;
channels electrically connected with each other by the channel connection pattern, each of the channels extending through the gate electrodes, the support layer and the channel connection pattern in the first direction on the CSP;
a first conductive through via extending through some of the gate electrodes on the substrate, the first conductive through via electrically connected to a first gate electrode at an uppermost level of the some of the gate electrodes, and the first conductive through via electrically insulated from second gate electrodes from among the some of the gate electrodes that are disposed under the first gate electrode;
a second conductive through via at a same level as the first conductive through via, the second conductive through via not extending through the gate electrodes and the second conductive through via electrically connected to one of the lower wirings;
a third conductive through via at the same level as the first conductive through via, the third conductive through via extending through and insulated from each of the gate electrodes of the stacked staircase shape of gate electrodes, the channel connection pattern, the support layer and the CSP and electrically connected to another one of the lower wirings; and
a plurality of first insulation structures between the first conductive through via and respective sidewalls of the second gate electrodes that electrically insulate the first conductive through via from each of the second gate electrodes, wherein the plurality of first insulation structures are respectively disposed at different levels, each level corresponding to a respective one of the gate electrodes, and a plurality of second insulation structures between the third conductive through via and respective sidewalls of the gate electrodes that electrically insulate the third conductive through via from each of the gate electrodes, wherein the plurality of second insulation structures are respectively disposed at different levels, each level corresponding to a respective one of the gate electrodes.

* * * * *